United States Patent
Katakam et al.

(12)

(10) Patent No.: US 12,550,714 B2
(45) Date of Patent: Feb. 10, 2026

(54) LATE MIDDLE-OF-LINE GATE CUT WITH POWER BAR FORMATION

(71) Applicant: International Business Machines Corporation, Armonk, NY (US)

(72) Inventors: Shravana Kumar Katakam, Lehi, UT (US); Tao Li, Slingerlands, NY (US); Indira Seshadri, Niskayuna, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 576 days.

(21) Appl. No.: 18/060,056

(22) Filed: Nov. 30, 2022

(65) Prior Publication Data

US 2024/0178142 A1    May 30, 2024

(51) Int. Cl.
| | |
|---|---|
| *H01L 23/528* | (2006.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ...... *H01L 23/5286* (2013.01); *H01L 23/5283* (2013.01); *H10D 30/014* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 64/01* (2025.01); *H10D 84/0186* (2025.01); *H10D 84/038* (2025.01); *H10D 84/85* (2025.01)

(58) Field of Classification Search
None
See application file for complete search history.

(56) References Cited

U.S. PATENT DOCUMENTS

| | | |
|---|---|---|
| 9,570,395 B1 | 2/2017 | Sengupta |
| 10,586,765 B2 | 3/2020 | Smith |

(Continued)

FOREIGN PATENT DOCUMENTS

| | | | |
|---|---|---|---|
| TV | 202230190 A | | 8/2022 |
| TW | 202042310 A | | 11/2020 |

(Continued)

OTHER PUBLICATIONS

Taiwan Search Report, Taiwan Application No. 112120005, Dated Mar. 15, 2024, 6 Pages.

*Primary Examiner* — Nilufa Rahim
(74) *Attorney, Agent, or Firm* — Robert R. Aragona

(57) ABSTRACT

According to the embodiment of the present invention, a semiconductor device includes a first nanodevice comprised of a plurality of first transistors and a second nanodevice comprised of a plurality of second transistors. The first nanodevice includes a first source/drain contact. The second nanodevice includes a second source/drain contact. The second nanodevice is located adjacent to and parallel to the first nanodevice. A power bar is located between the first nanodevice and the second nanodevice. The power bar is connected to the second source/drain contact. A top surface of the power bar and the second source/drain contact are substantially in a same plane. The top surface of the power bar and the second source/drain contact are substantially a same height.

25 Claims, 29 Drawing Sheets

Top Down View

(51) Int. Cl.
  *H10D 64/01*      (2025.01)
  *H10D 84/01*      (2025.01)
  *H10D 84/03*      (2025.01)
  *H10D 84/85*      (2025.01)

(56) References Cited

U.S. PATENT DOCUMENTS

| | | | |
|---|---|---|---|
| 10,636,739 | B2 | 4/2020 | Beyne |
| 10,700,207 | B2 | 6/2020 | Chen |
| 10,734,224 | B2 | 8/2020 | Smith |
| 11,133,254 | B2 | 9/2021 | Lai |
| 11,222,892 | B2 | 1/2022 | Su |
| 11,342,326 | B2 | 5/2022 | Chiu |
| 2020/0075574 | A1 | 3/2020 | Smith |
| 2020/0105671 | A1 | 4/2020 | Lai |
| 2020/0328212 | A1 | 10/2020 | Wu |
| 2021/0111115 | A1 | 4/2021 | Morrow |
| 2021/0167066 | A1 | 6/2021 | Harshitha |
| 2021/0336019 | A1 | 10/2021 | Su |
| 2021/0343645 | A1 | 11/2021 | Peng |
| 2021/0376076 | A1 | 12/2021 | Su |
| 2021/0384295 | A1 | 12/2021 | Park |
| 2022/0020666 | A1 | 1/2022 | Van Dal |
| 2022/0216150 | A1 | 7/2022 | Shin |
| 2022/0310472 | A1 | 9/2022 | Huang |
| 2022/0328496 | A1 | 10/2022 | Kang |
| 2022/0359375 | A1 | 11/2022 | Huang |
| 2023/0369222 | A1* | 11/2023 | Engel ............... H10D 30/014 |
| 2024/0047455 | A1* | 2/2024 | Li .................. H10D 84/017 |
| 2024/0128161 | A1* | 4/2024 | Lee .................. H01L 23/5286 |

FOREIGN PATENT DOCUMENTS

| | | |
|---|---|---|
| TW | 202141655 A | 11/2021 |
| TW | 202147549 A | 12/2021 |
| TW | 202205590 A | 2/2022 |
| TW | 202240857 A | 10/2022 |
| TW | I855710 B | 9/2024 |

\* cited by examiner

Top Down View

Cross Section Y1

Cross Section X

Cross Section Y₂

Cross Section Y₁

Top Down View

Cross Section X

Cross Section Y₁

Cross Section Y₂

Cross Section X

Cross Section $Y_2$

Cross Section $Y_1$

Top Down View

Cross Section X

Cross Section Y₁

Cross Section Y₂

Cross Section X

Cross Section Y2

Cross Section Y1

Top Down View

Top Down View

Top Down View

Top Down View

Top Down View

Top Down View

Cross Section X

Cross Section Y₂

Cross Section Y₁

Cross Section X

Cross Section Y₂

Cross Section Y₁

Cross Section X

Cross Section Y₁

Cross Section Y₂

Cross Section X

Cross Section Y₁

Cross Section Y₂

Cross Section X

Cross Section Y₁

Cross Section Y₂

Cross Section X

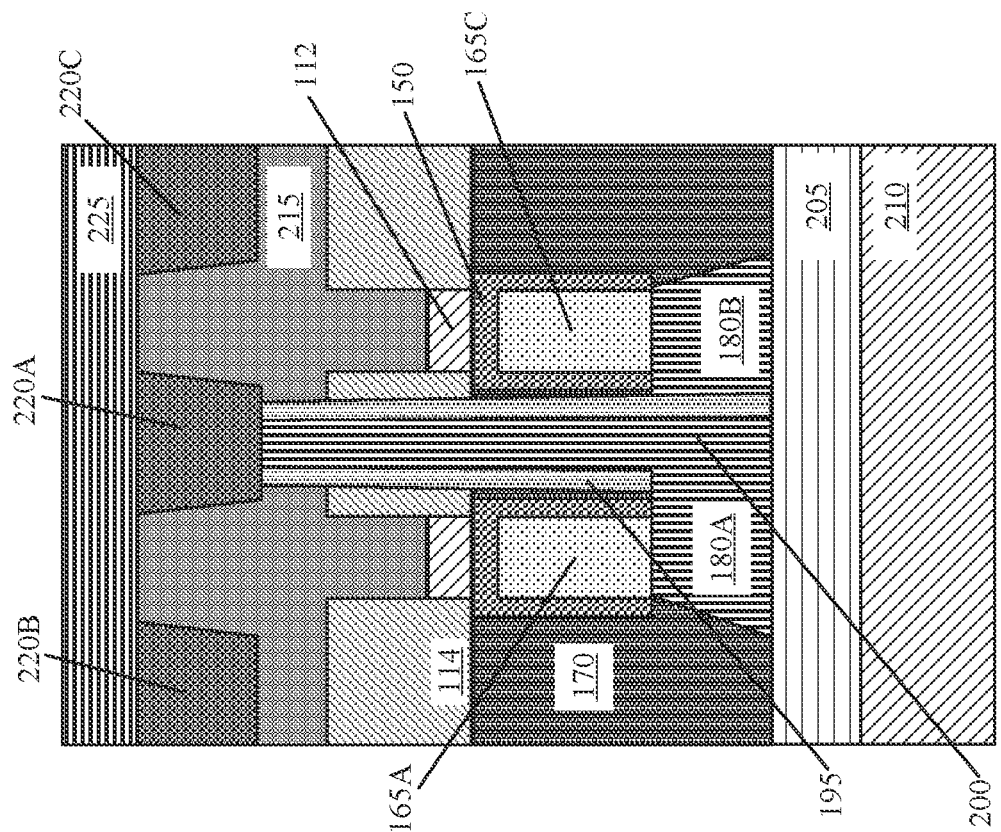
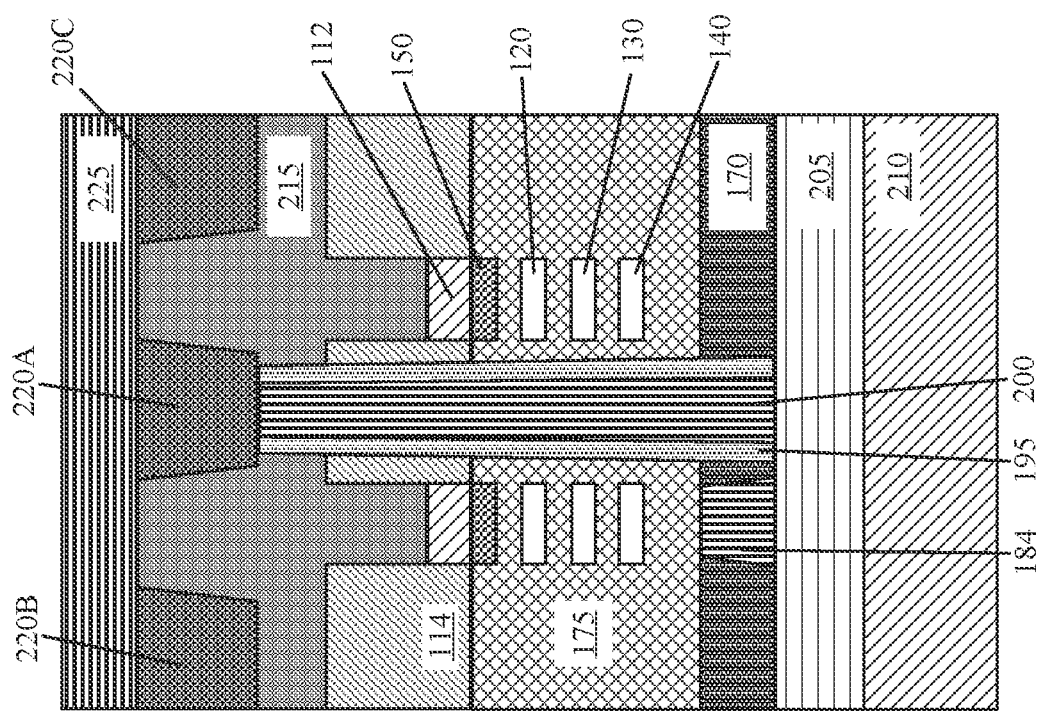
FIG. 38
Cross Section Y₂
FIG. 37
Cross Section Y₁

LATE MIDDLE-OF-LINE GATE CUT WITH POWER BAR FORMATION

BACKGROUND

The present invention relates generally to the field of microelectronics, and more particularly to a semiconductor device structure, and a method for forming a semiconductor device.

A nanosheet (NS) is the lead device architecture in continuing CMOS scaling. However, nanosheet technology has shown issues when scaling down such that as the devices become smaller and closer together, they are interfering with each other. Furthermore, as the devices become smaller and closer together, forming the connections to a backside power network is becoming more difficult.

SUMMARY

According to the embodiment of the present invention, a semiconductor device includes a first nanodevice comprised of a plurality of first transistors and a second nanodevice comprised of a plurality of second transistors. The first nanodevice includes a first source/drain contact. The second nanodevice includes a second source/drain contact. The second nanodevice is located adjacent to and parallel to the first nanodevice. A power bar is located between the first nanodevice and the second nanodevice. The power bar is connected to the second source/drain contact. A top surface of the power bar and the second source/drain contact are substantially in a same plane. The top surface of the power bar and the second source/drain contact are substantially a same height.

According to the embodiment of the present invention, the power bar is oriented adjacent to and parallel to the first nanodevice and the second nanodevice.

According to the embodiment of the present invention, the semiconductor device further comprises a first dielectric liner and a second dielectric liner. The first dielectric liner is located between the first nanodevice and the power bar. The second dielectric liner is located between the second nanodevice and the power bar.

According to the embodiment of the present invention, a first height of the first dielectric liner is greater than a second height of the second dielectric liner.

According to the embodiment of the present invention, the second dielectric liner has an opening. The second source/drain contact extends through the opening to connect to the power bar.

According to the embodiment of the present invention, the semiconductor device further comprises a backside power rail located directly atop the power bar, the first dielectric liner, and the second dielectric liner.

According to the embodiment of the present invention, the first nanodevice further includes a first source/drain. The first source/drain contact is connected to a first frontside of the first source/drain. The second nanodevice further includes a second source/drain. The second source/drain contact is connected to a second frontside of the second source/drain. The power bar extends to a backside of the second nanodevice to connect to the backside power rail.

According to the embodiment of the present invention, the first source/drain contact is separated from the power bar by the first dielectric liner.

According to the embodiment of the present invention, a semiconductor device includes a first nanodevice comprised of a plurality of first transistors and a second nanodevice comprised of a plurality of second transistors. The first nanodevice includes a first source/drain contact and a second source/drain contact. The second nanodevice includes a third source/drain contact and a fourth source/drain contact. The second nanodevice is located adjacent to and parallel to the first nanodevice. A power bar is located between the first nanodevice and the second nanodevice. The power bar is connected to at least two source/drain contacts.

According to the embodiment of the present invention, the power bar is oriented adjacent to and parallel to the first nanodevice and the second nanodevice.

According to the embodiment of the present invention, the semiconductor device further comprises a first dielectric liner and a second dielectric liner. The first dielectric liner is located between the first nanodevice and the power bar. The second dielectric liner is located between the second nanodevice and the power bar.

According to the embodiment of the present invention, the power bar is connected to the second source/drain contact and the third source/drain contact. The first dielectric liner has a first opening where the second source/drain contact is connected to the power bar. The second dielectric liner has a second opening where the third source/drain contact is connected to the power bar. The second source/drain contact and the third source/drain contact are offset from each other across the first nanodevice and the second nanodevice.

According to the embodiment of the present invention, the power bar is connected to the first source/drain contact and the third source/drain contact. The first dielectric liner has a first opening where the first source/drain contact is connected to the power bar. The second dielectric liner has a second opening where the third source/drain contact is connected to the power bar. The first source/drain contact and the third source/drain contact are in-line with each other across the first nanodevice and the second nanodevice.

According to the embodiment of the present invention, the power bar is connected to the first source/drain contact and the second source/drain contact. The first dielectric liner has a first opening where the first source/drain contact is connected to the power bar. The first dielectric liner has a second second opening where the second source/drain contact is connected to the power bar. The first source/drain contact and the second source/drain contact are in-line with each other across the first nanodevice.

According to the embodiment of the present invention, the power bar is connected to the third source/drain contact and the fourth source/drain contact. The second dielectric liner has a first opening where the third source/drain contact is connected to the power bar. The second dielectric liner has a second opening where the fourth source/drain contact is connected to the power bar. The third source/drain contact and the fourth source/drain contact are in-line with each other across the second nanodevice.

According to the embodiment of the present invention, the power bar is connected to the first source/drain contact and the fourth source/drain contact. The first dielectric liner has a first opening where the first source/drain contact is connected to the power bar. The second dielectric liner has a second opening where the fourth source/drain contact is connected to the power bar. The first source/drain contact and the fourth source/drain contact are offset from each other across the first nanodevice and the second nanodevice.

According to the embodiment of the present invention, the semiconductor device further comprises a plurality of gates extending perpendicular to a first axis along a second axis through the first nanodevice and the second nanodevice. The power bar extends along the first axis through the plurality of gates.

According to the embodiment of the present invention, a semiconductor device includes a first nanodevice comprised of a plurality of first transistors and a second nanodevice comprised of a plurality of second transistors. The first nanodevice includes a first source/drain contact, a second source/drain contact, and a third source/drain contact. The second nanodevice includes a fourth source/drain contact, a fifth source/drain contact, and a sixth source/drain contact. The second nanodevice is located adjacent to and parallel to the first nanodevice. A power bar is located between the first nanodevice and the second nanodevice. The power bar is connected to at least two source/drain contacts.

According to the embodiment of the present invention, the semiconductor device further comprises a first dielectric liner and a second dielectric liner. The first dielectric liner is located between the first nanodevice and the power bar. The second dielectric liner is located between the second nanodevice and the power bar.

According to the embodiment of the present invention, the power bar is connected to the third source/drain contact and the fourth source/drain contact. The first dielectric liner has a first opening where the third source/drain contact is connected to the power bar. The second dielectric liner has a second opening where the fourth source/drain contact is connected to the power bar.

According to the embodiment of the present invention, the third source/drain contact and the fourth source/drain contact are offset from each other across the first nanodevice and the second nanodevice.

According to the embodiment of the present invention, at least one source/drain contact is located between the third source/drain contact and the fourth source/drain contact.

According to the embodiment of the present invention, the semiconductor device further comprises at least four gates extending perpendicular to a first axis along a second axis through the first nanodevice and the second nanodevice. The power bar extends along the first axis through the at least four gates.

According to the embodiment of the present invention, a first nanodevice comprised of a plurality of first transistors and a second nanodevice comprised of a plurality of second transistors are formed. The first nanodevice is formed to include a first source/drain contact. The second nanodevice is formed to include a second source/drain contact. The second nanodevice is formed adjacent to and parallel to the first nanodevice. A power bar is formed between the first nanodevice and the second nanodevice. The power bar is formed to connect to the second source/drain contact. A top surface of the power bar and the second source/drain contact are formed substantially in a same plane. The top surface of the power bar and the second source/drain contact are formed to be substantially a same height.

According to the embodiment of the present invention, the first source/drain contact, the second source/drain contact, and the power bar are formed by removing a lithography mask layer and a portion of a dielectric liner. A space created by the removal of the lithography mask layer and the portion of the dielectric liner is filled with a conductive metal.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 36-38 illustrate cross sections X, $Y_1$, and $Y_2$, respectively, of the plurality of nanodevices after the formation of a backside power distribution network (BSPDN), in accordance with the embodiment of the present invention.

DETAILED DESCRIPTION

Figure 1:
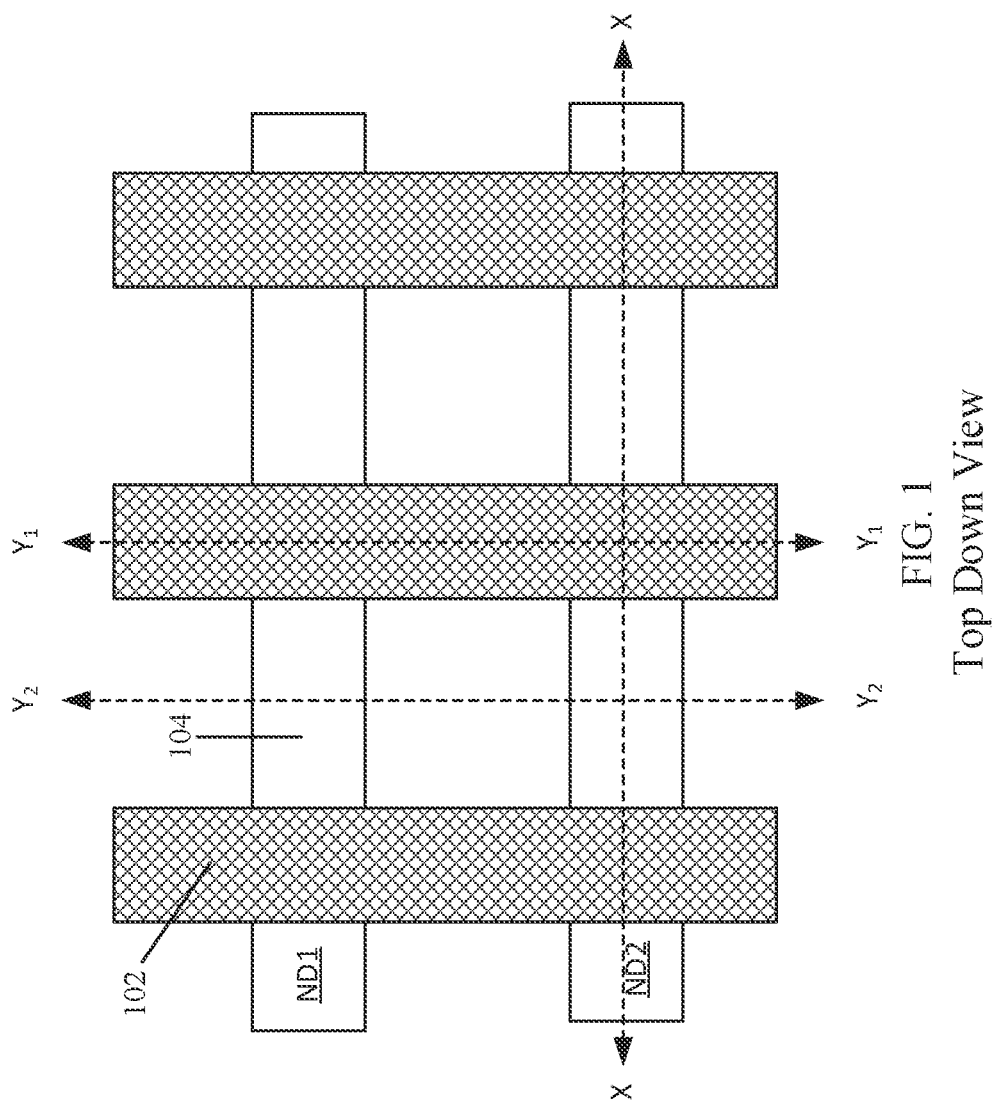
FIG. 1 illustrates a top-down view of a plurality of nanodevices, in accordance with the embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

References in the specification to "one embodiment," "an embodiment," "an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "formed on," or "formed atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be a direct or indirect positional relationship. As an example of an indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes which are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout.

When a via extends downwards from a frontside contact the via may be located between two active regions on a nanodevice. The downwards extending via is connected to a component, for example, a backside power rail. The size of the via is limited by a contact component/gate piece. For example, when a space between P-Channel Field Effect Transistors (PFET) and/or N-Channel Field Effect Transistors (NFET) is 40 nanometers, the critical dimension of the via is extremely small (e.g., 8 nanometers). The small critical dimension results in a high resistance via, which may increase the response time (i.e., a slower response) of the PFET and/or NFET transistors. Additionally, the via may have a high aspect ratio resulting in more complex patterning.

By inserting a frontside power bar with a larger contact area and lower aspect ratio than that of a conventional via, the resistance of the frontside power bar may be reduced, thus greatly improving the response time (i.e., a faster response) of the PFET and/or NFET transistors. Additionally, the lower aspect ratio of the frontside power bar may simplify patterning. The present invention does not require that all advantages need to be incorporated into every embodiment of the invention.

The present invention is directed to forming a frontside power bar in a space between a plurality of nanodevices (e.g., PFET and/or NFET transistors) such that the frontside power bar connects a plurality of source/drain contacts to a backside power rail (BPR). The frontside power bar is formed through a multistage processing, where the first stage forms a first trench by etching a portion of the gates and the source/drain contacts. The second stage forms a dielectric liner inside the first trench. The third stage etches a portion of the dielectric liner to form a second trench adjacent to and connected to the first trench. The fourth stage fills the first trench and the second trench with a conductive metal, forming the frontside power bar that includes the plurality of source/drain contacts.

FIG. 1 illustrates a top-down view of a plurality of nanodevices ND1, ND2, in accordance with the embodiment of the present invention. The adjacent and parallel devices include a first nanodevice ND1 comprised of a plurality of first transistors, and a second nanodevice ND2 comprised of a plurality of second transistors. Cross-section X is a cross section perpendicular to the gates along the horizontal axis of the second nanodevice ND2. Cross-section $Y_1$ is a cross section parallel to the gates in the gate region 102 across the plurality of nanodevices ND1, ND2. Cross-section $Y_2$ is a cross section parallel to the gates in the source/drain region 104 across the plurality of nanodevices ND1, ND2. It may be appreciated that the embodiment of the present invention is not limited to nanodevices ND1, ND2 and that other devices including, but not limited to, FinFET, nanowire, and a planar device may also be used.

Figure 2:
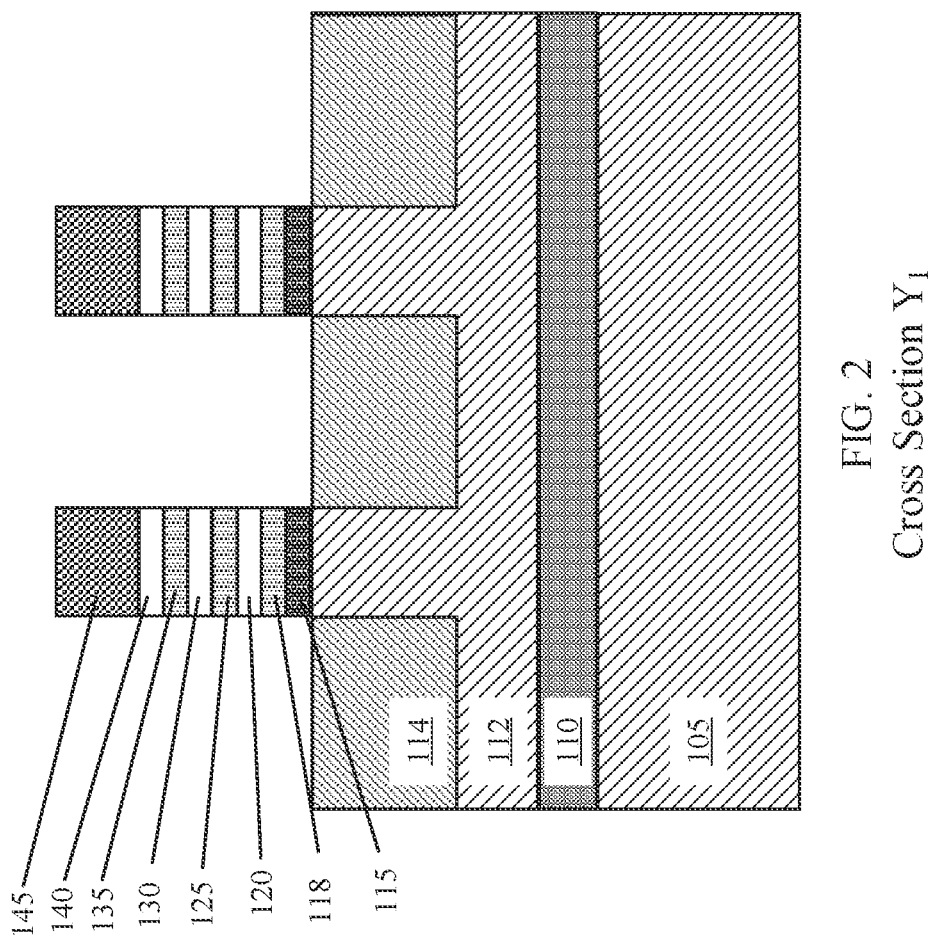
FIG. 2 illustrates cross section $Y_1$ of the plurality of nanodevices after nanosheet formation, shallow trench isolation (STI) region formation, gate hard mask formation, and etch stop layer formation, in accordance with the embodiment of the present invention.

FIG. 2 illustrates cross section $Y_1$ of the plurality of nanodevices ND1, ND2 after nanosheet 120, 130, 140 formation, shallow trench isolation (STI) region 114 formation, gate hard mask 145 formation, and etch stop layer 110 formation, in accordance with the embodiment of the present invention. The plurality of nanodevices ND1, ND2 include a substrate 105, an etch stop layer 110, an underlying substrate layer 112, an STI region 114, a first sacrificial layer 115, a second sacrificial layer 118, a first nanosheet 120, a third sacrificial layer 125, a second nanosheet 130, a fourth sacrificial layer 135, a third nanosheet 140, and a gate hard mask 145. The substrate 105 and the etch stop layer 110 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 and the etch stop layer 110 may be doped, undoped or contain doped regions and undoped regions therein.

The first sacrificial layer 115 is formed directly atop the underlying substrate layer 112. The second sacrificial layer 118 is formed directly atop the first sacrificial layer 115. The first nanosheet 120 is formed directly atop the second sacrificial layer 118. The third sacrificial layer 125 is formed directly atop the first nanosheet 120. The second nanosheet 130 is formed directly atop the third sacrificial layer 125. The fourth sacrificial layer 135 is formed directly atop the second nanosheet 130. The third nanosheet 140 is formed directly atop the fourth sacrificial layer 135. The gate hard mask 145 is formed directly atop the third nanosheet 140. The first sacrificial layer 115, the second sacrificial layer 118, the third sacrificial layer 125, and the fourth sacrificial layer 135 are hereinafter referred to as the plurality of sacrificial layers 115, 118, 125, 135. In addition, the first nanosheet 120, the second nanosheet 130, and the third nanosheet 140 are hereinafter referred to as the plurality of nanosheets 120, 130, 140. The plurality of sacrificial layers 115, 118, 125, 135 may be comprised of, for example, SiGe, where Ge is about 35%. The plurality of nanosheets 120, 130, 140 may be comprised of, for example, Si. The number of nanosheets and the number of sacrificial layers described above are not intended to be limiting, and it may be appreciated that in the embodiment of the present invention the number of nanosheets and the number of sacrificial layers may vary. After formation of the plurality of nanosheets 120, 130, 140 and the plurality of sacrificial layers 115, 118, 125, 135, together the nanosheet stack, the nanosheet stack (comprising alternative Si and SiGe layers over a bottom most high Ge % SiGe layer) may be further patterned using conventional lithography and etching processes. After nanosheet stack formation and patterning, the STI region 114 is formed by dielectric filling, CMP, and dielectric recess.

Figure 3:
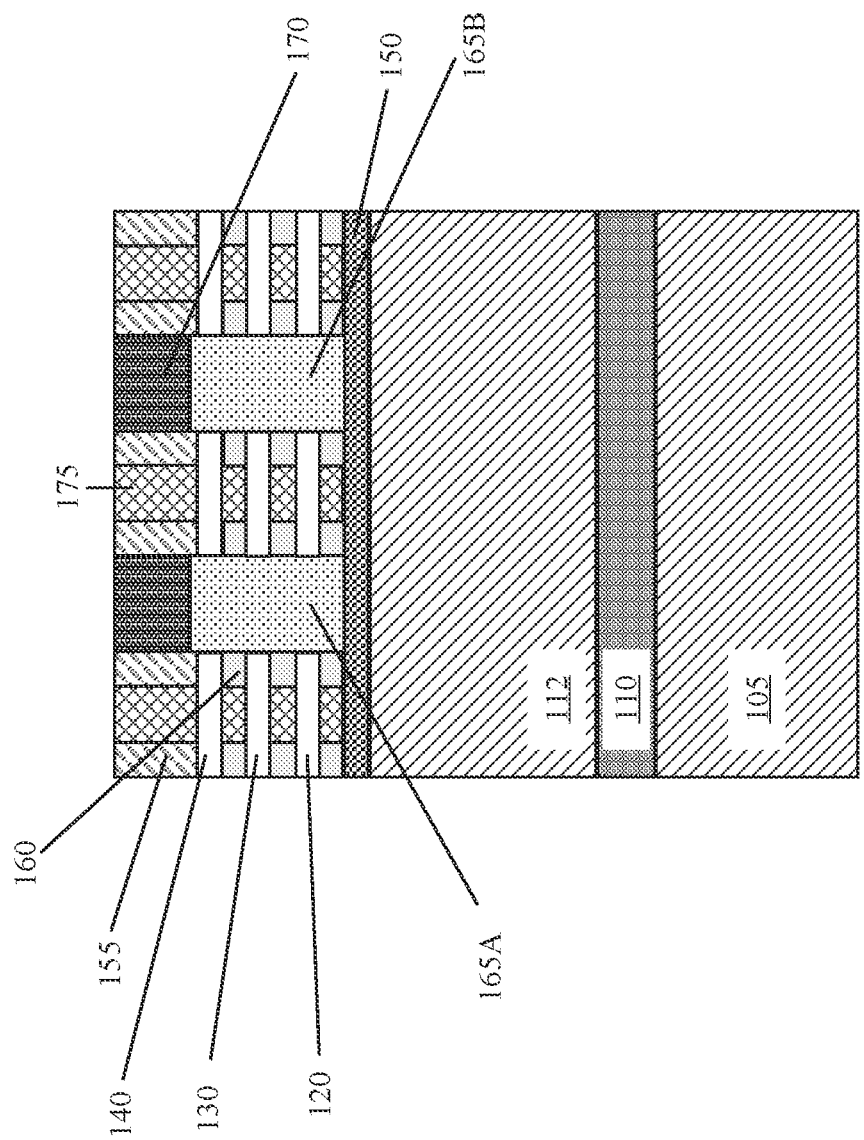
FIGS. 3-5 illustrate cross sections X, $Y_1$, and $Y_2$, respectively, of the plurality of nanodevices after interlayer dielectric (ILD) deposition, chemical-mechanical planarization (CMP), and gate formation, gate spacer and inner spacer formation, source/drain formation, and bottom dielectric isolation (BDI) layer formation, in accordance with the embodiment of the present invention.
Figure 5:
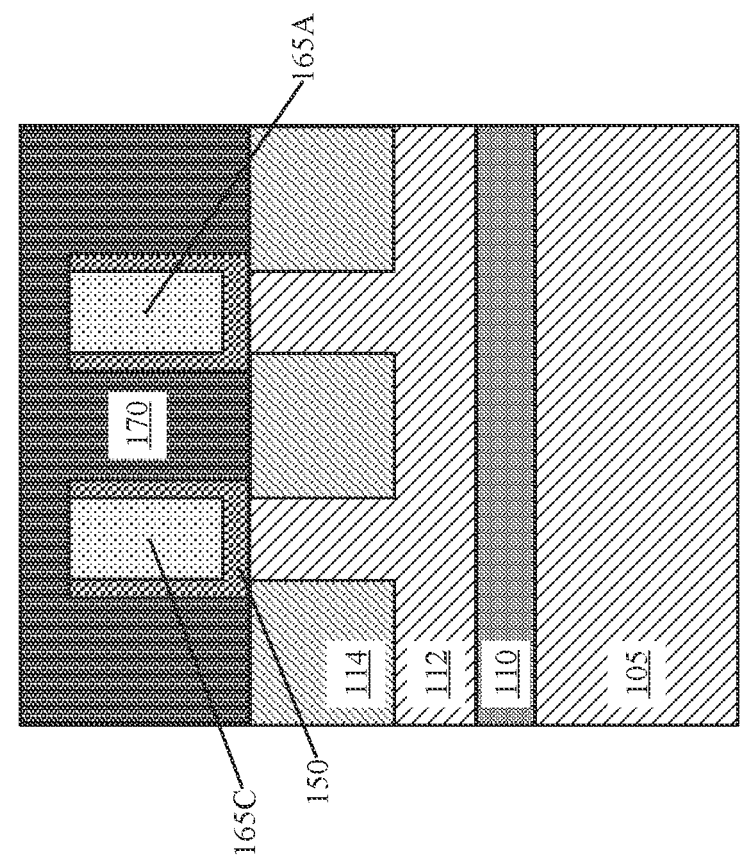
Figure 4:
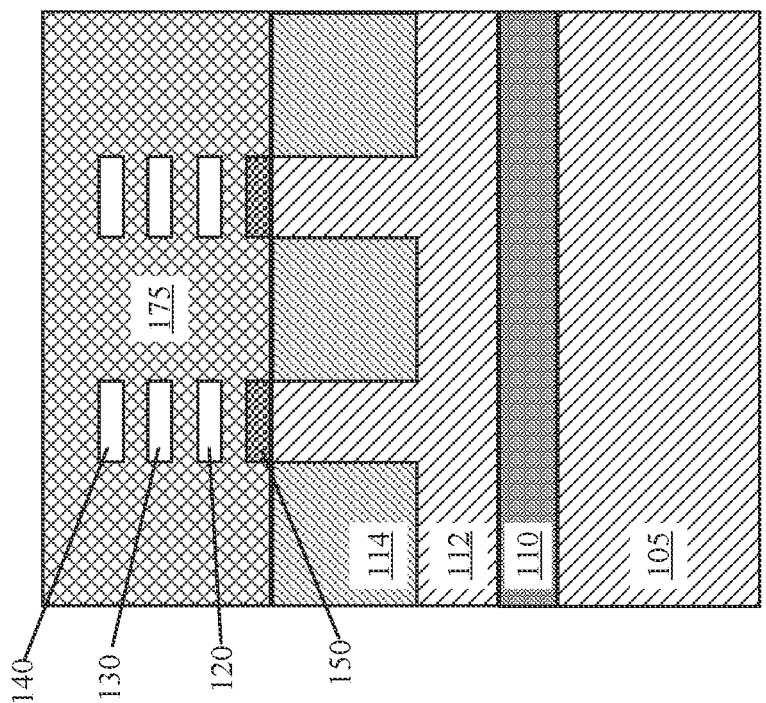

FIGS. 3-5 illustrate cross sections X, $Y_1$, and $Y_2$, respectively, of the plurality of nanodevices ND1, ND2 after interlayer dielectric (ILD) 170 deposition, CMP, and gate 175 formation, gate spacer 155 and inner spacer 160 formation, source/drain 165A, 165B, 165C formation, and bottom dielectric isolation (BDI) layer 150 formation, in accordance with the embodiment of the present invention. The bottom most high Ge % SiGe layer is selectively removed, followed by gate spacer 155 and BDI layer 150 formation by a conformal dielectric liner deposition followed by anisotropic etch. Then, the nanosheet stack at the S/D region 104 is recessed, followed by indentation of sacrificial SiGe and inner spacer 160 formation. Then, the first source/drain 165A, the second source/drain 165B, and the third source/drain 165C are epitaxially grown over exposed sidewalls of the plurality of nanosheets 120, 130, 140, followed by ILD 170 deposition and CMP to remove the gate hard mask 145. Then, the sacrificial SiGe are removed, followed by gate 175 formation. The first source/drain 165A, the second source/drain 165B, and the third source/drain 165C are formed directly atop the BDI layer 150. In FIG. 5, the BDI layer 150 is located directly atop the underlying substrate layer 112 and between two inner spacers 160. The two inner spacers 160 and the BDI layer 150 form a contiguous unitary structure made of the same or a different dielectric material. The first source/drain 165A and the third source/drain 165C are surrounded on three sides by the contiguous unitary structure.

The first source/drain 165A, the second source/drain 165B, and the third source/drain 165C can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

In FIG. 3, the ILD 170 is formed directly atop the first source/drain 165A and the second source/drain 165B, and surrounds one side of the gate spacer 155. In FIG. 5, the ILD 170 is formed directly atop the first source/drain 165A, the third source/drain 165C, the contiguous unitary structure, and the STI region 114.

In FIG. 3, a gate material is deposited in the space created by the removal of the second sacrificial layer 118, the third sacrificial layer 125, and the fourth sacrificial layer 135 and directly atop the third nanosheet 140 to form a replacement gate (i.e., the gate 175). In FIG. 4, the gate material is deposited in the space created by the removal of the second sacrificial layer 118, the third sacrificial layer 125, and the fourth sacrificial layer 135 and directly atop the third nanosheet 140 and the STI region 114 to form the gate 175. The gate 175 can be comprised of, for example, a gate dielectric liner, such as a high-k dielectric like HfO2, ZrO2, HfLaOx, etc., and work function layers, such as TiN, TiAlC, TiC, etc., and conductive metal fills, like W.

Figure 6:
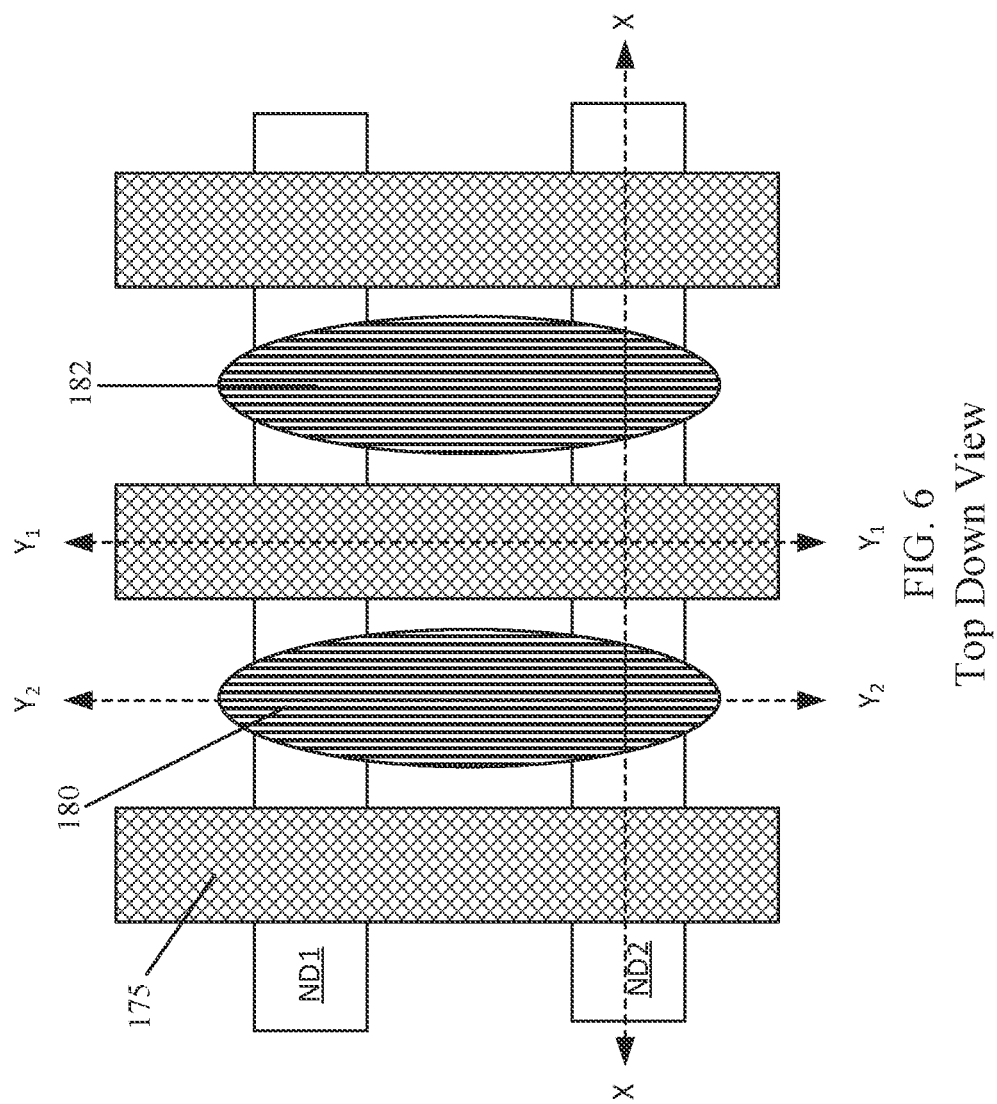
FIG. 6 illustrates a top-down view of the plurality of nanodevices after the formation of a first main source/drain contact and a second main source/drain contact, in accordance with the embodiment of the present invention.

FIG. 6 illustrates a top-down view of the plurality of nanodevices ND1, ND2 after the formation of a first main source/drain contact 180 and a second main source/drain contact 182, in accordance with the embodiment of the present invention. A plurality of trenches (not shown) formed during middle-of-line (MOL) patterning are filled with a conductive metal (e.g., including a silicide liner, such as Ni. Ti, NiPt, an adhesion metal liner, such as TiN and conductive metal fill, such as W, Co, or Ru) to form the main source/drain contacts 180, 182 (FIGS. 7 and 9) for the source/drains 165A, 165B, 165C (FIGS. 7 and 9) and the gate contact 184 (FIG. 8). The first main source/drain contact 180 extends vertically across the first nanodevice ND1 and the second nanodevice ND2 between two gates 175. The second main source/drain contact 182 extends parallel to the first main source/drain contact 180 across the first nanodevice ND1 and the second nanodevice ND2 between two gates 175.

Figure 7:
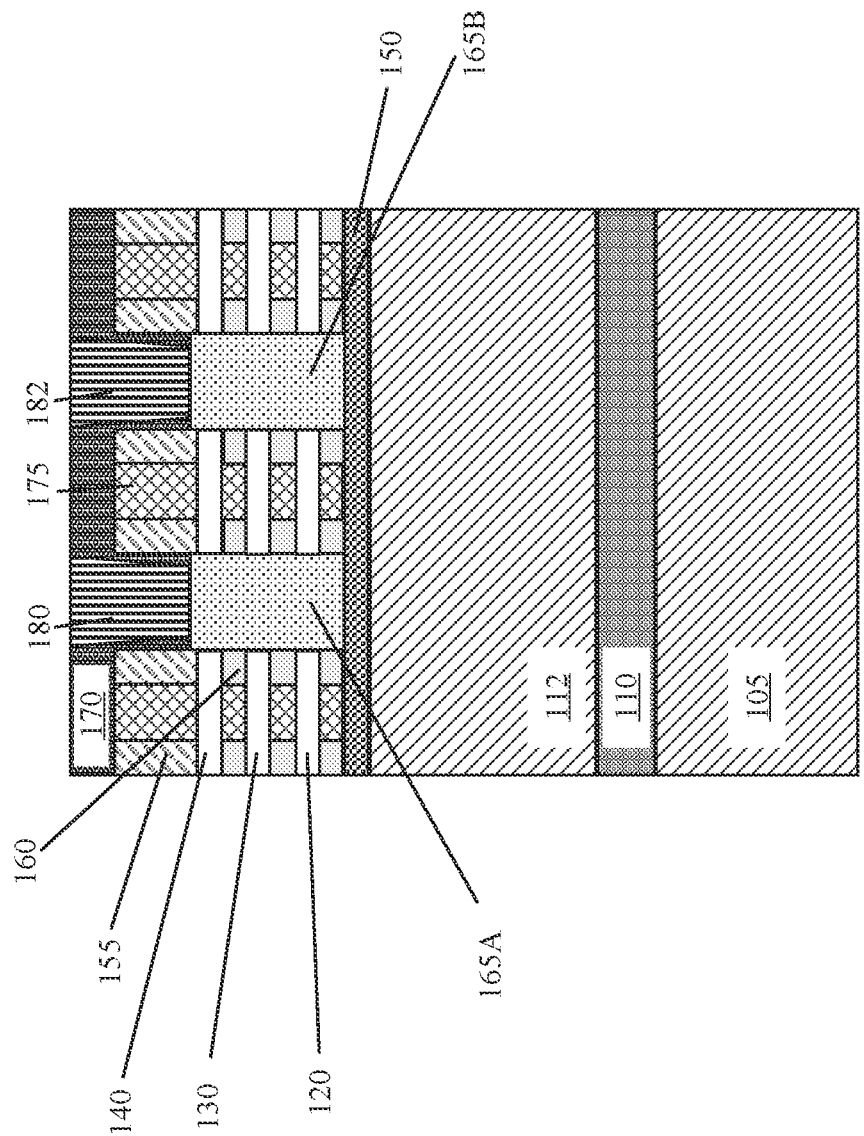
FIGS. 7-9 illustrate cross sections X, $Y_1$, and $Y_2$, respectively, of the plurality of nanodevices after the formation of the first main source/drain contact, the second main source/drain contact, and a gate contact in accordance with the embodiment of the present invention.
Figures 8, 9:
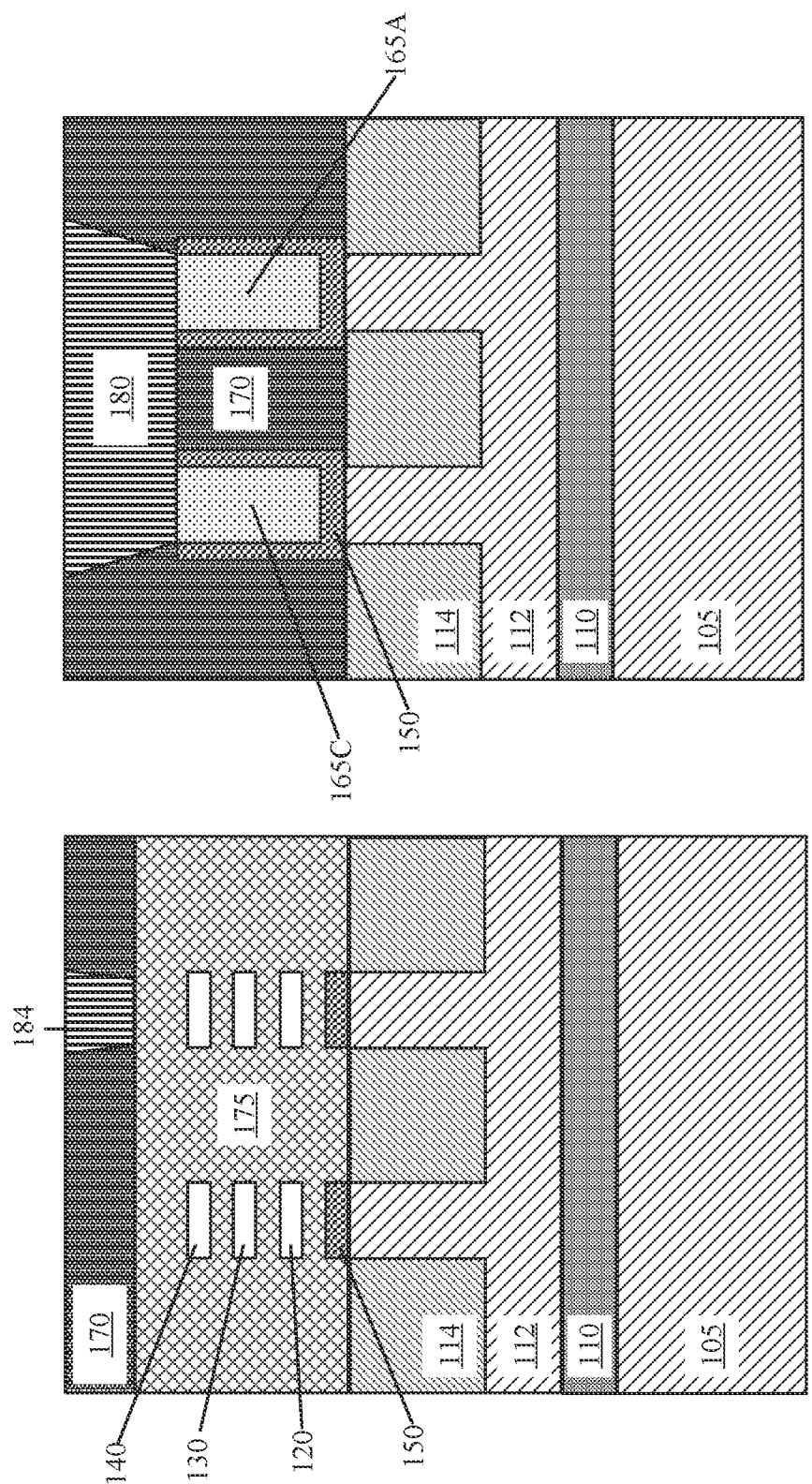

FIGS. 7-9 illustrate cross sections X, $Y_1$, and $Y_2$, respectively, of the plurality of nanodevices ND1, ND2 after the formation of the first main source/drain contact 180, the second main source/drain contact 182, and a gate contact 184 in accordance with the embodiment of the present invention. In FIG. 7, the first main source/drain contact 180 is located directly atop the first source/drain 165A. The second main source/drain contact 182 is located directly atop the second source/drain 165B. In FIG. 8, the gate contact 184 is located directly atop the gate 175. In FIG. 9, the first main source/drain contact 180 is located directly atop the first source/drain 165A and the third source/drain 165C.

Figure 10:
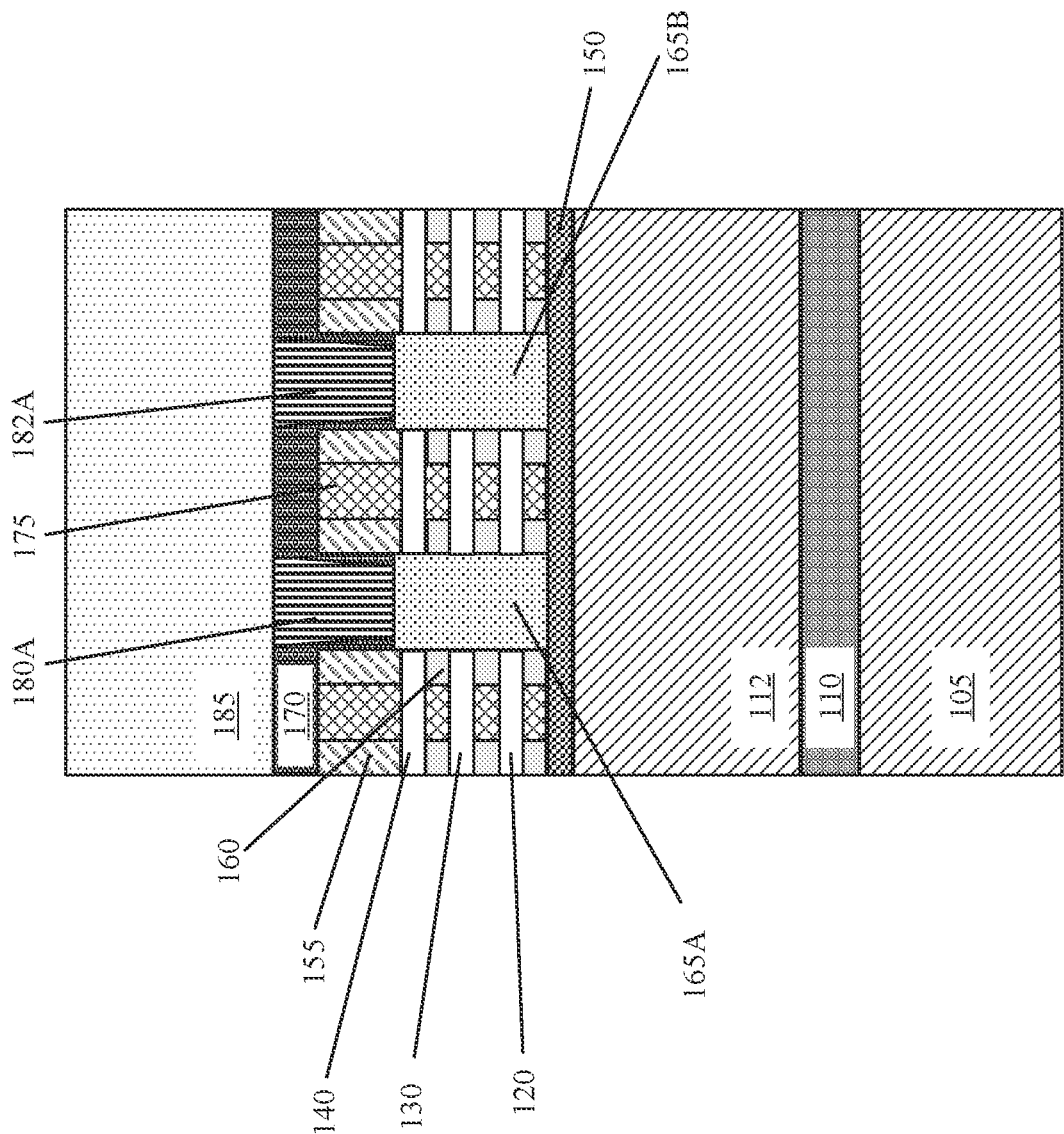
FIGS. 10-12 illustrate cross sections X, $Y_1$, and $Y_2$, respectively, of the plurality of nanodevices after the formation of a lithography mask layer and a first trench, in accordance with the embodiment of the present invention.
Figure 12:
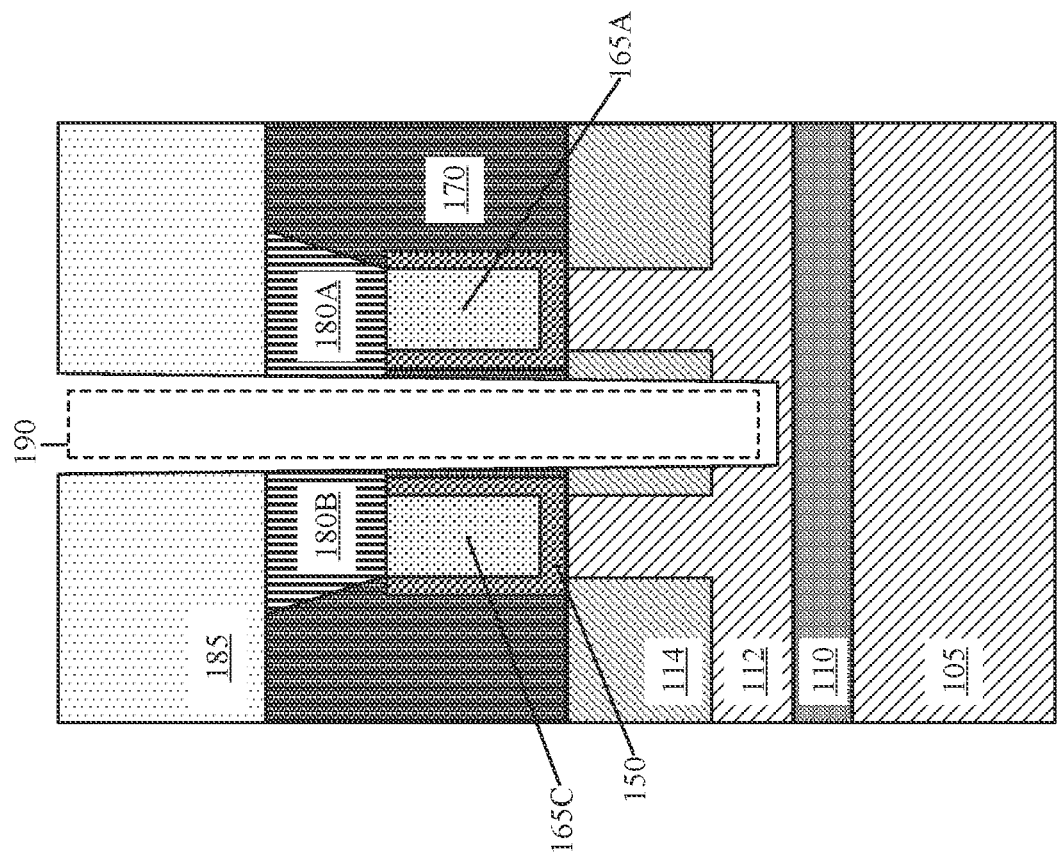
Figure 11:
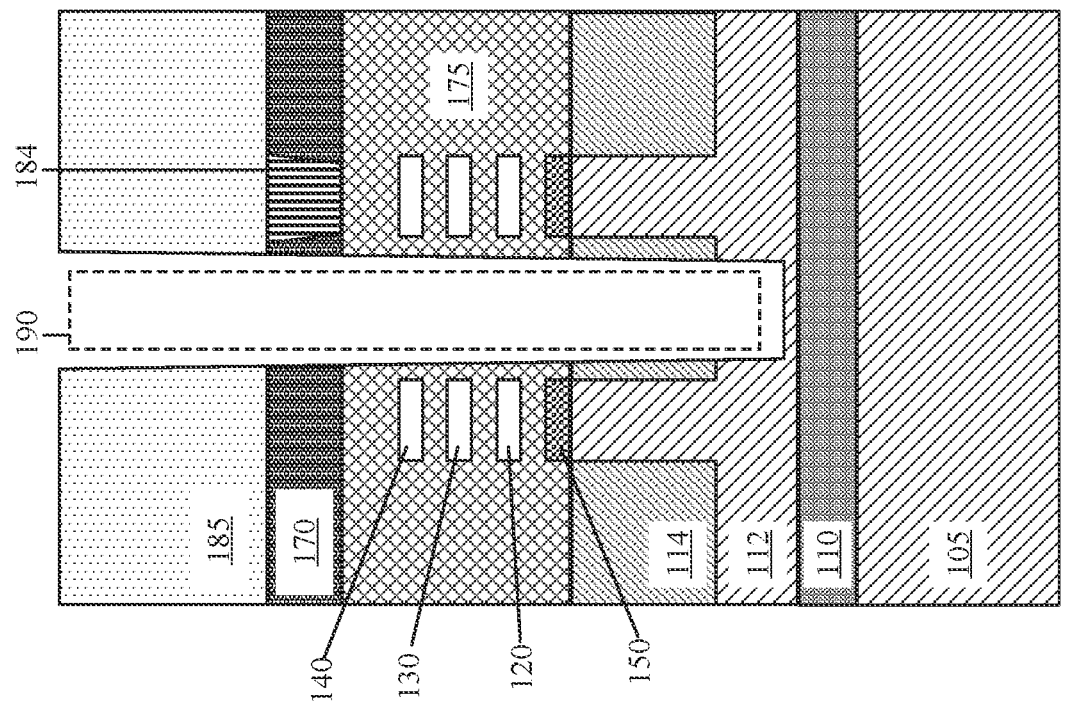
Figure 13:
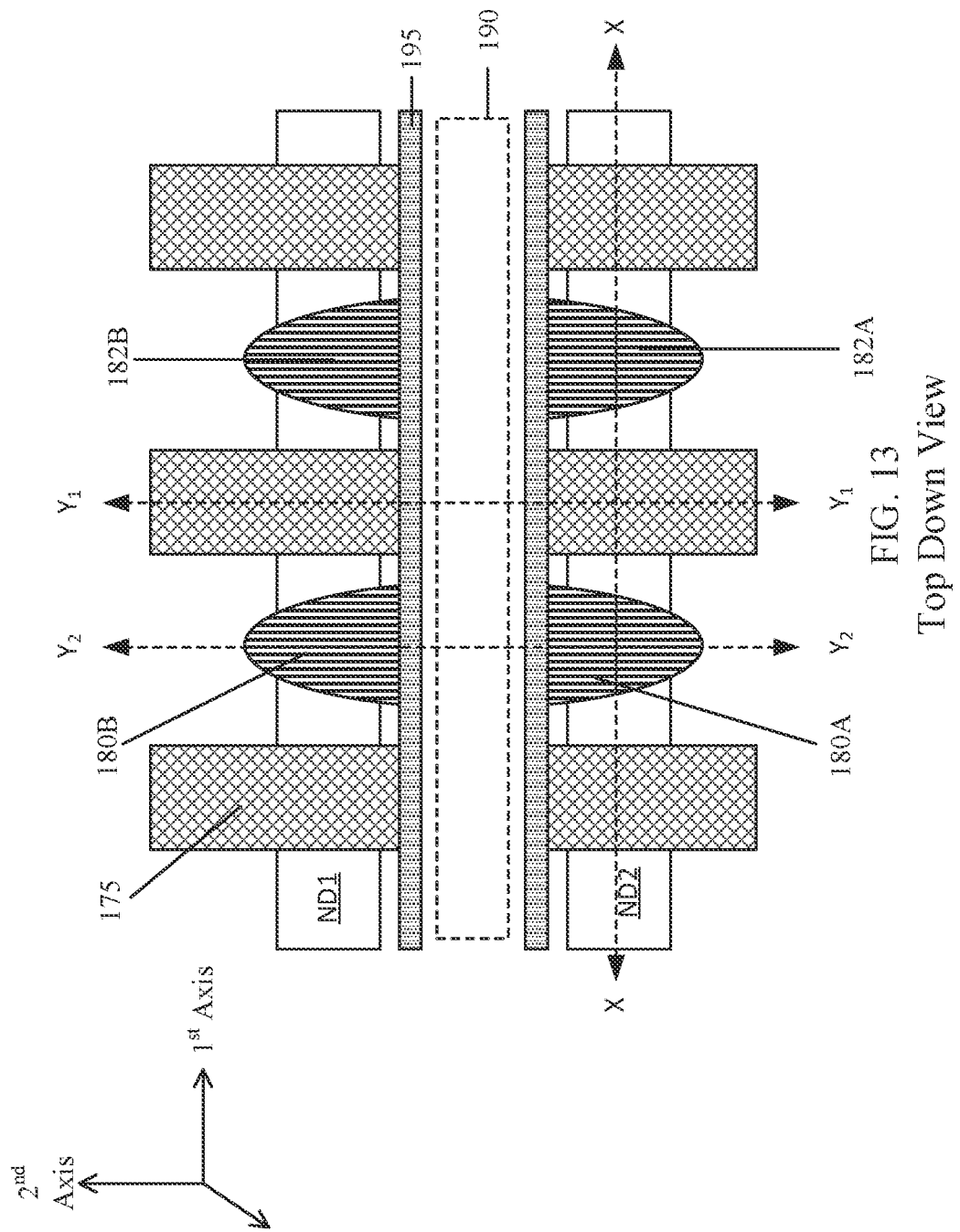
FIG. 13 illustrates a top-down view of the plurality of nanodevices after the formation of the first trench and a dielectric liner, in accordance with the embodiment of the present invention.

FIGS. 10-12 illustrate cross sections X, $Y_1$, and $Y_2$, respectively, of the plurality of nanodevices ND1, ND2 after the formation of a lithography mask layer 185 and a first trench 190, in accordance with the embodiment of the present invention. In FIG. 10, the lithography mask layer 185, for example, an organic planarization layer (OPL), is deposited directly atop the ILD 170, a first source/drain contact 180A of the second nanodevice ND2 (FIG. 13), and a second source/drain contact 182A of the second nanodevice ND2 (FIG. 13). In FIG. 11, the lithography mask layer 185 is deposited and then patterned directly atop the ILD 170 and the gate contact 184 to expose a portion of the underlying ILD 170. The exposed portion of the ILD 170, a portion of the gate 175, a portion of the STI region 114, and a portion of the underlying substrate layer 112 are etched to form the first trench 190. In FIG. 12, the lithography mask layer 185 is deposited and then patterned directly atop the ILD 170, the first source/drain contact 180A of the second nanodevice ND2 (FIG. 13), and a first source/drain contact 180B of a first nanodevice ND1 (FIG. 13) to expose a portion of the first source/drain contact 180A of the second nanodevice ND2 (FIG. 13) and the first source/drain contact 180B of the first nanodevice ND1 (FIG. 13). The exposed portion of the first source/drain contact 180A of the second nanodevice ND2 (FIG. 13) and the first source/drain contact 180B of the first nanodevice ND1 (FIG. 13), a portion of the ILD 170, a portion of the STI region 114, and a portion of the underlying substrate layer 112 are etched to form the first trench 190. In FIGS. 10-12, the lithography mask layer 185 is formed by depositing, for example, an OPL material in a spin-on coating process. A bottom surface of the first trench 190 exposes a portion of a top surface of the underlying substrate layer 112.

Figures 15, 16:
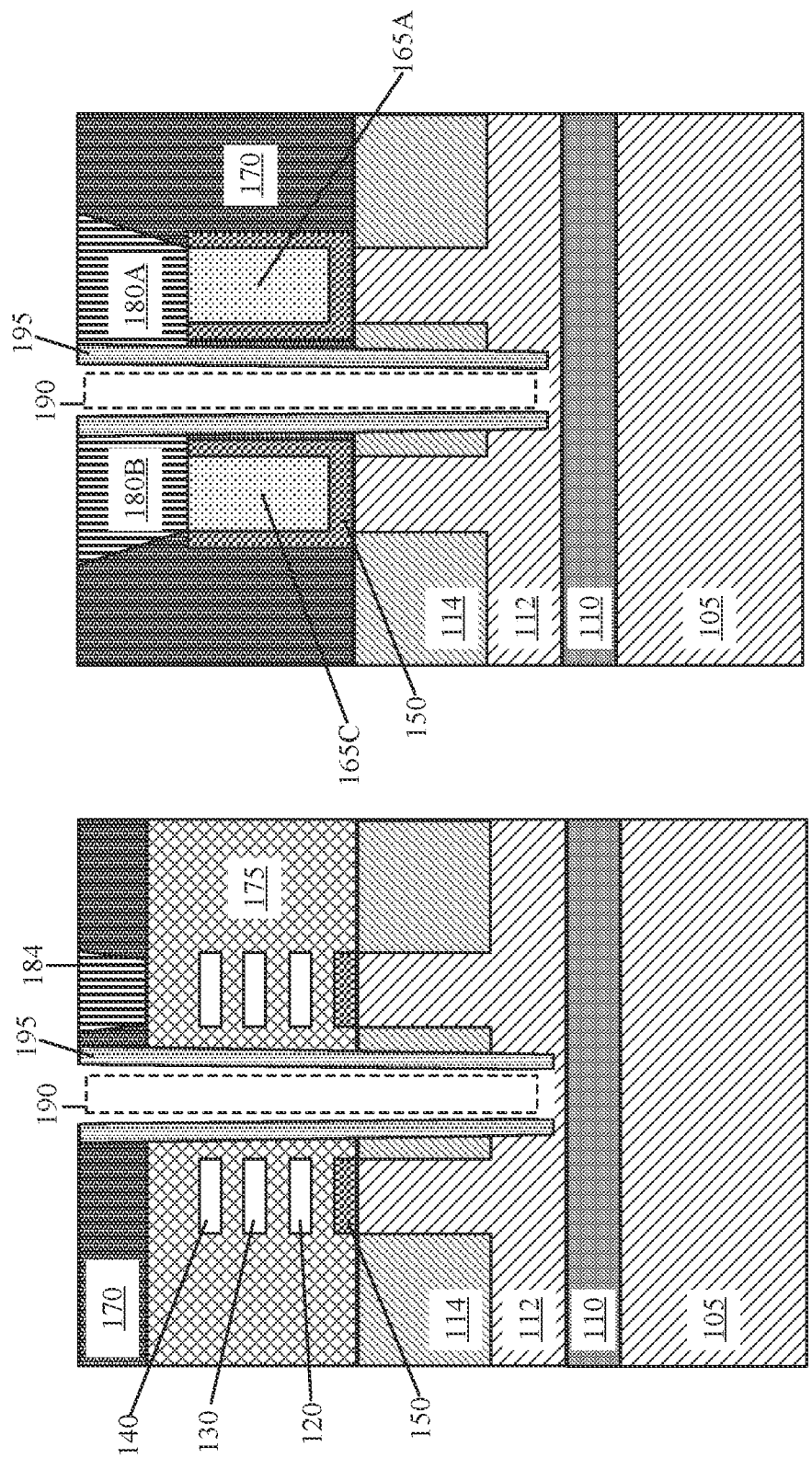

FIG. 13 illustrates a top-down view of the plurality of nanodevices ND1, ND2 after the formation of the first trench 190 and a dielectric liner 195, in accordance with the embodiment of the present invention. FIG. 13 is meant to illustrate a cut in the first main source/drain contact 180 and the second main source/drain contact 182 to form a plurality of source/drain contacts 180A, 180B, 182A, 182B. The first trench 190 extends along a first axis through a plurality of gates 175. A liner material is deposited in the first trench 190 and etched back to form the dielectric liner 195 located on the sidewalls of the first trench 190 (FIGS. 15-16). The dielectric liner 195 is comprised of a first dielectric liner and a second dielectric liner. The first source/drain contact 180A of the second nanodevice ND2 extends downwards along a second axis from the second dielectric liner through the second nanodevice ND2. The second source/drain contact 182A of the second nanodevice ND2 extends downwards along the second axis from the second dielectric liner through the second nanodevice ND2. The first source/drain contact 180B of the first nanodevice ND1 extends upwards along the second axis from the first dielectric liner through the first nanodevice ND1. A second source/drain contact 182B of the first nanodevice ND1 extends upwards along the second axis from the first dielectric liner through the first nanodevice ND1.

Figure 14:
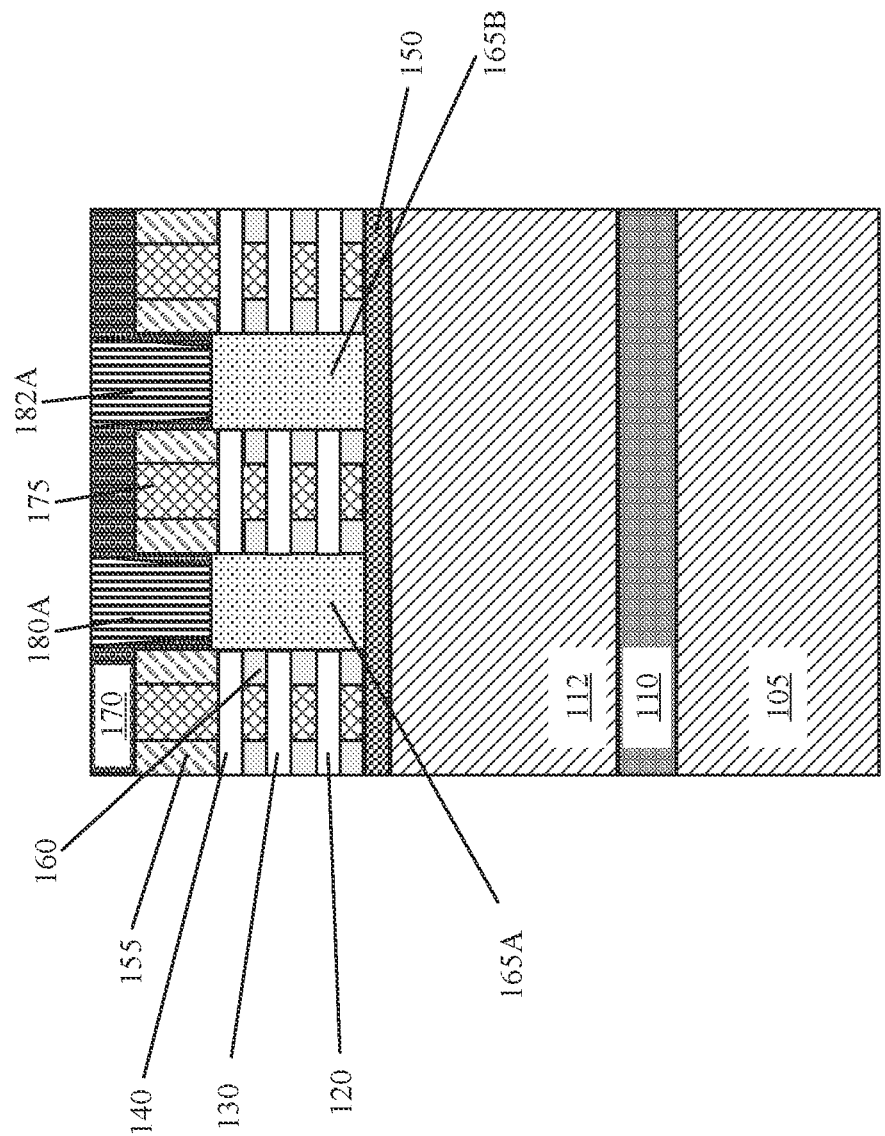
FIGS. 14-16 illustrate cross sections X, $Y_1$, and $Y_2$, respectively, of the plurality of nanodevices after the formation of the first trench and the dielectric liner, in accordance with the embodiment of the present invention.

FIGS. 14-16 illustrate cross sections X, $Y_1$, and $Y_2$, respectively, of the plurality of nanodevices ND1, ND2 after the formation of the first trench 190 and the dielectric liner 195, in accordance with the embodiment of the present invention. The lithography mask layer 185 is removed. As described above with respect to the description of FIG. 13, the liner material is deposited in the first trench 190 and etched back to form the dielectric liner 195 located on the sidewalls of the first trench 190. In FIG. 15, a portion of the sidewalls of the dielectric liner 195 is in contact with the underlying substrate layer 112, the STI region 114, the gate 175, or the ILD 170, respectively. In FIG. 16, a portion of the sidewalls of the dielectric liner 195 is in contact with the underlying substrate layer 112, the STI region 114, the ILD 170, or the first source/drain contact 180A of the second nanodevice ND2 and the first source/drain contact 180B of the first nanodevice ND1, respectively.

Figure 17:
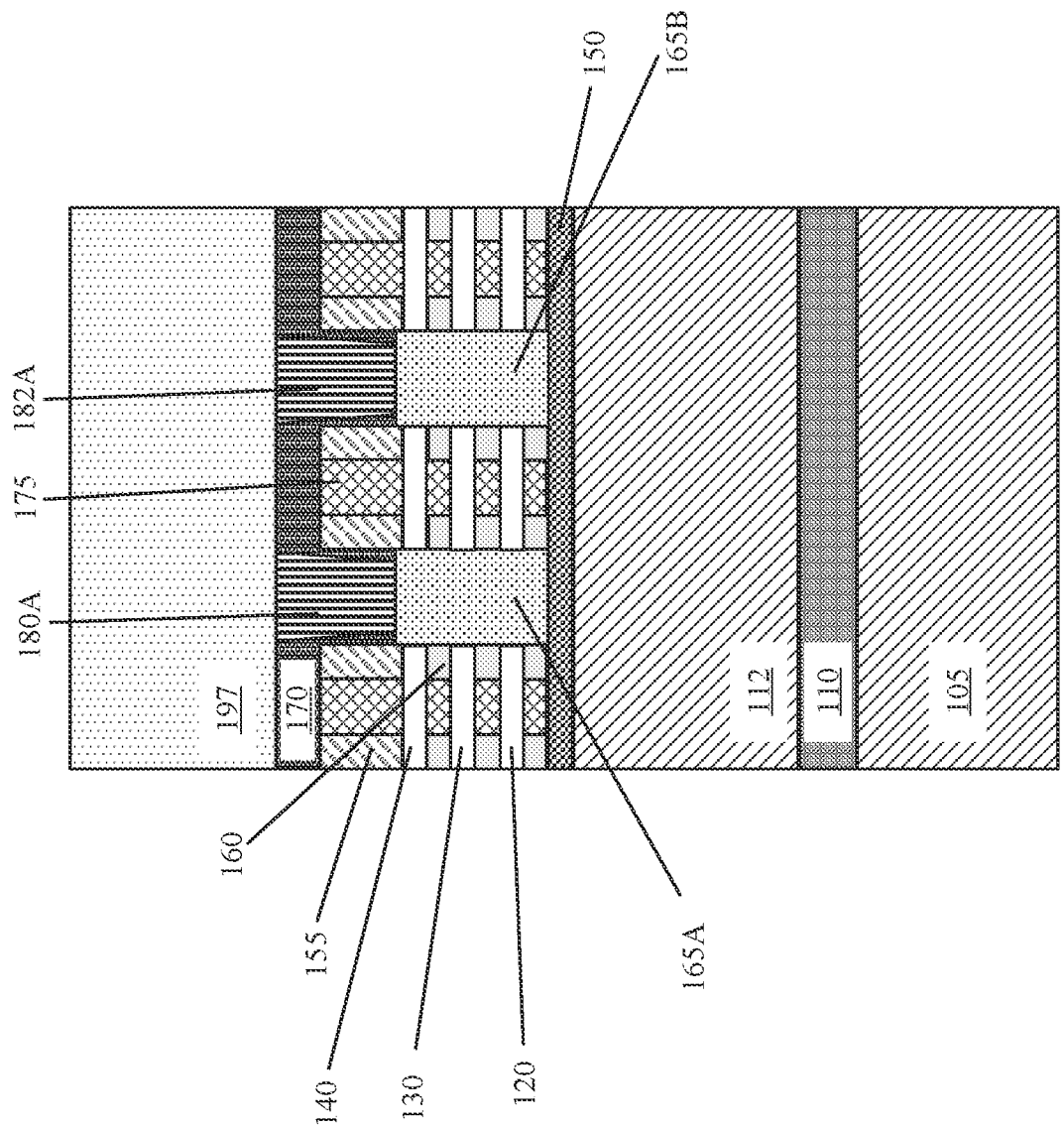
FIGS. 17-19 illustrate cross sections X, $Y_1$, and $Y_2$, respectively, of the plurality of nanodevices after the formation of a second lithography mask layer and a second trench, in accordance with the embodiment of the present invention.
Figure 19:
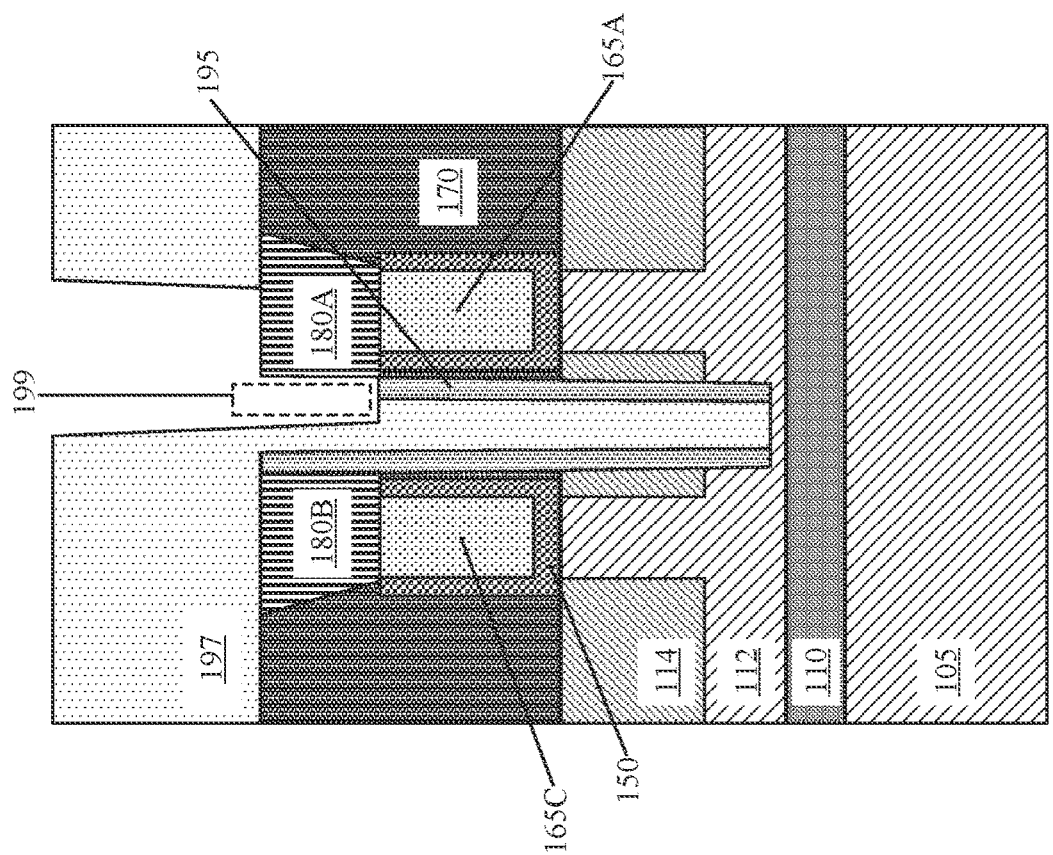
Figure 18:
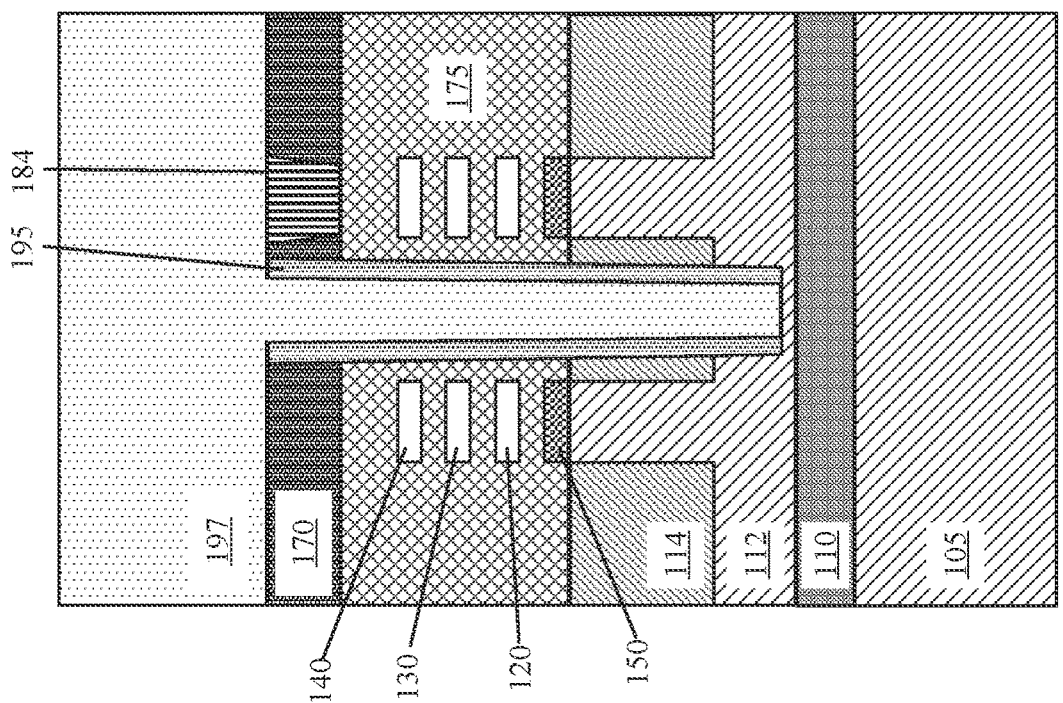

FIGS. 17-19 illustrate cross sections X, $Y_1$, and $Y_2$, respectively, of the plurality of nanodevices ND1, ND2 after the formation of a second lithography mask layer 197 and a second trench 199, in accordance with the embodiment of the present invention. In FIG. 17, the second lithography mask layer 197, for example, an organic planarization layer (OPL), is deposited directly atop the ILD 170, the first source/drain contact 180A of the second nanodevice ND2, and the second source/drain contact 182A of the second nanodevice ND2. In FIG. 18, the second lithography mask layer 197 is deposited directly atop the ILD 170, the gate contact 184, and in the first trench 190. In FIG. 19, the second lithography mask layer 197 is deposited and then patterned directly atop the ILD 170, the first source/drain contact 180A of the second nanodevice ND2, the first source/drain contact 180B of the first nanodevice ND1, and in the first trench 190 to expose a portion of the first source/drain contact 180A of the second nanodevice ND2 and a portion of the dielectric liner 195. The exposed portion of the dielectric liner 195 is etched by, for example, RIE to form the second trench 199. A bottom surface of the second trench 199 exposes a portion of a top surface of the dielectric liner 195 and the second lithography mask layer 197. In FIGS. 17-19, the second lithography mask layer 197 is formed by depositing, for example, an OPL material in a spin-on coating process.

FIGS. 20A-20F illustrate a top-down view of the plurality of nanodevices ND1, ND2 after the formation of a power bar 200, in accordance with the embodiment of the present invention. FIGS. 20A-20F are meant to illustrate the formation of the power bar 200 which connects to one or more of the source/drain contacts. The second lithography mask layer 197 is removed. The space created by the removal of the second lithography mask layer 197 and the second trench 199 are filled with the conductive metal to form the power bar 200. The power bar 200 is oriented adjacent to and parallel to the first nanodevice ND1 and the second nanodevice ND2 between the first nanodevice ND1 and the second nanodevice ND2. The power bar 200 extends along the first axis through a plurality of gates 175, where the plurality of gates 175 extend perpendicular to the first axis along the second axis through the first nanodevice ND1 and the second nanodevice ND2. As described above with respect to the description of FIG. 13, the dielectric liner 195 is comprised of a first dielectric liner and a second dielectric liner. The first dielectric liner is located between the first nanodevice ND1 and the power bar 200. The second dielectric liner is located between the second nanodevice ND2 and the power bar 200.

Figure 20A:
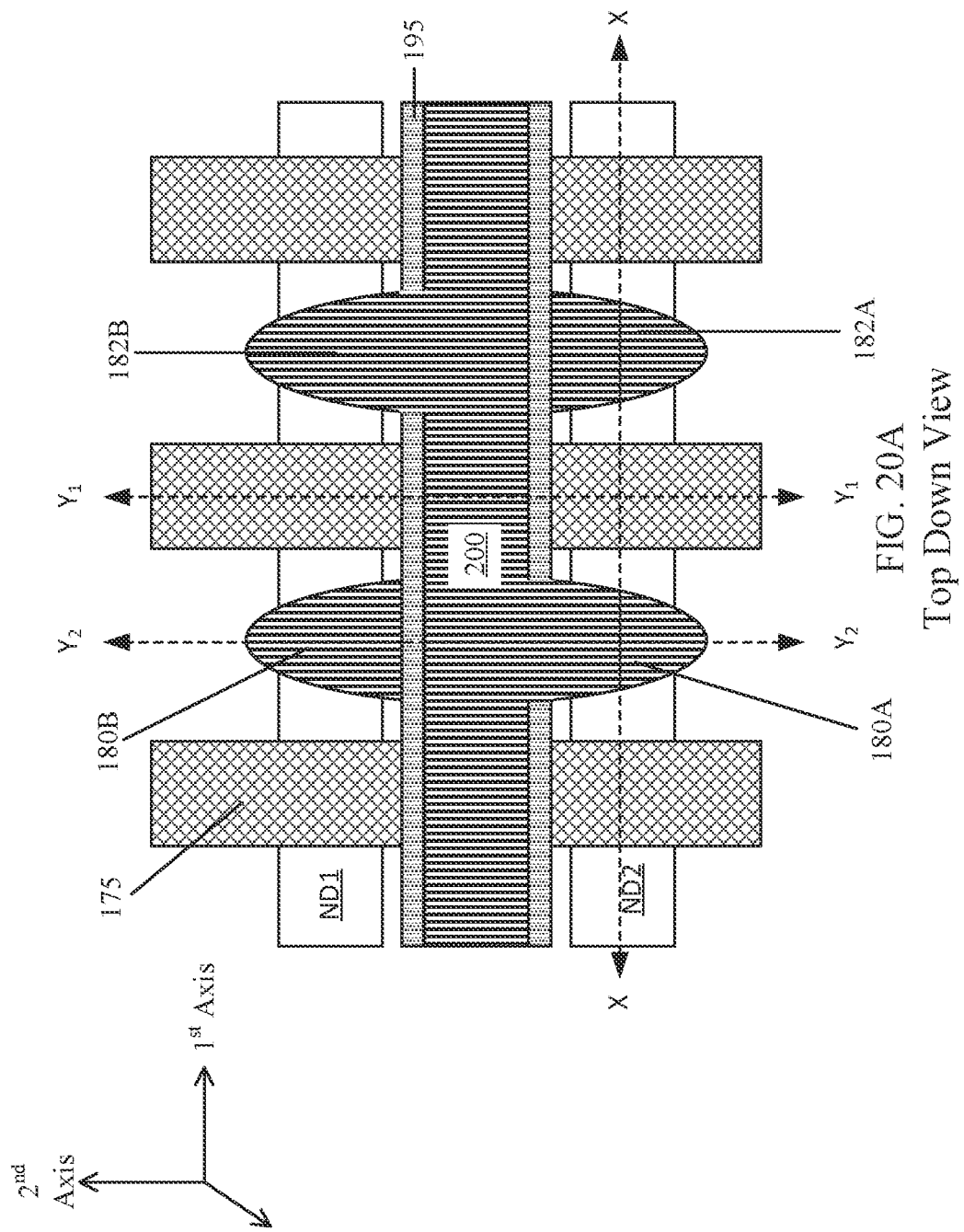
FIGS. 20A-20F illustrate a top-down view of the plurality of nanodevices after the formation of a power bar, in accordance with the embodiment of the present invention.
Figure 23:
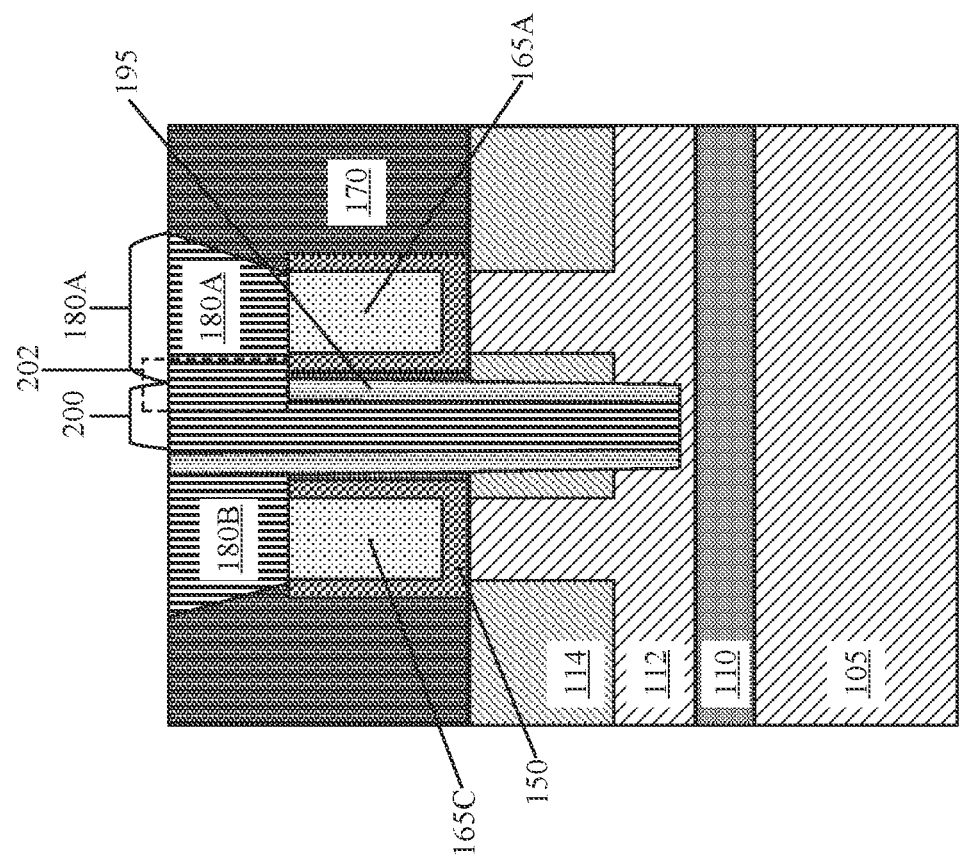

In FIG. 20A, the power bar 200 is connected to at least one source/drain contact, such as the first source/drain contact 180A of the second nanodevice ND2 (FIG. 23). The dielectric liner 195 may have an opening where the at least one source/drain contact is connected to the power bar 200. The opening is created by the removal of the exposed portion of the dielectric liner 195, described above with respect to the description of FIGS. 17-19.

According to at least one aspect of the disclosure, as illustrated in FIG. 20A, the power bar is connected to at least two source/drain contacts, such as the first source/drain contact 180A of the second nanodevice ND2 and the second source/drain contact 182B of the first nanodevice ND1, where the first source/drain contact 180A of the second nanodevice ND2 and the second source/drain contact 182B of the first nanodevice ND1 are offset from each other across the first nanodevice ND1 and the second nanodevice ND2. The first dielectric liner may have a first opening where the second source/drain contact 182B of the first nanodevice ND1 is connected to the power bar 200. The second dielectric liner may have a second opening where the first source/drain contact 180A of the second nanodevice ND2 is connected to the power bar 200.

Figure 20B:
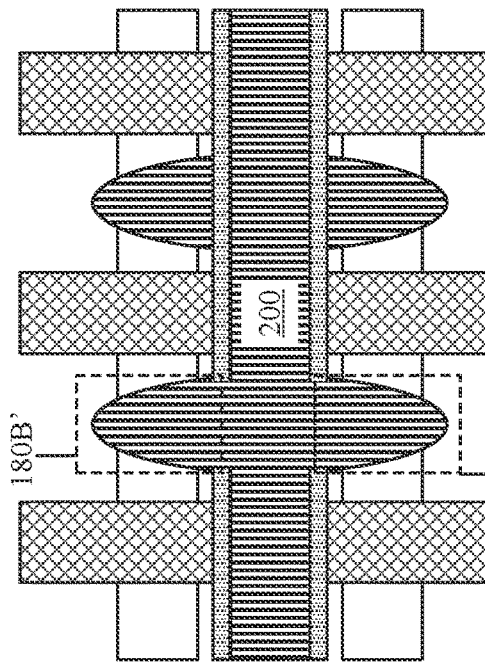

FIGS. 20B-20F are meant to illustrate that one of ordinary skill in the art may use the steps described above for different layouts of the first nanodevice ND1 and the second nanodevice ND2. In FIG. 20B, the source/drain contact in dashed box 180A' (e.g., the first source/drain contact 180A of the second nanodevice ND2) and the source/drain contact in dashed box 180B' (e.g., the first source/drain contact 180B of the first nanodevice ND1) are connected to the power bar 200, where the source/drain contact in dashed box 180A' and the source/drain contact in dashed box 180B' are in-line with each other across the first nanodevice ND1 and the second nanodevice ND2. The first dielectric liner may have a first opening where the source/drain contact in dashed box 180B' is connected to the power bar 200. The second dielectric liner may have a second opening where the source/drain contact in dashed box 180A' is connected to the power bar 200.

Figure 20D:
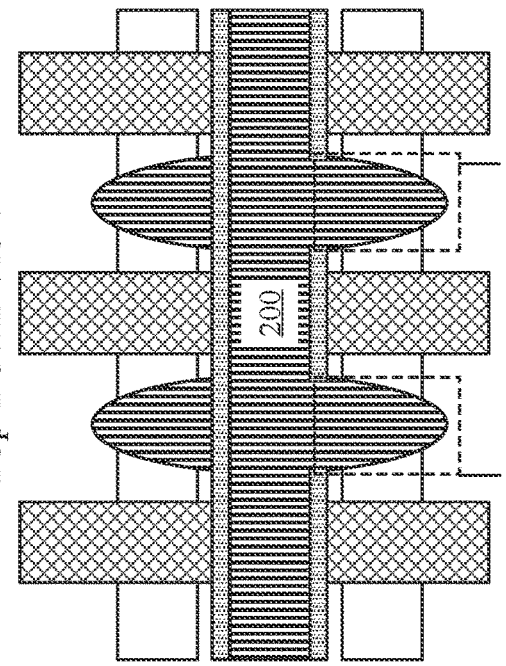
Figure 20C:
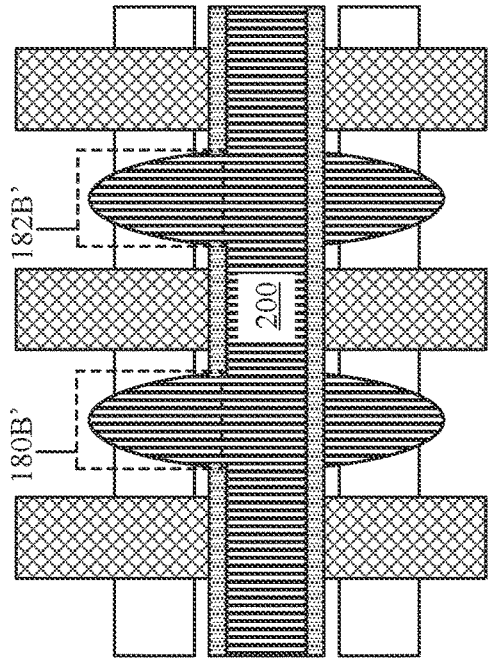

In FIG. 20C, the source/drain contact in dashed box 180B' (e.g., the first source/drain contact 180B of the first nanodevice ND1) and the source/drain contact in dashed box 182B' (e.g., the second source/drain contact 182B of the first nanodevice) are connected to the power bar 200, where the source/drain contact in dashed box 180B' and the source/drain contact in dashed box 182B' are in-line with each other across the first nanodevice ND1. The first dielectric liner may have a first opening where the source/drain contact in dashed box 180B' is connected to the power bar 200. The first dielectric liner may have a second opening where the source/drain contact in dashed box 182B' is connected to the power bar 200. The second dielectric liner may not have an opening.

In FIG. 20D, the source/drain contact in dashed box 180A' (e.g., the first source/drain contact 180A of the second nanodevice ND2) and the source/drain contact in dashed box 182A' (e.g., the second source/drain contact 182A of the second nanodevice ND2) are connected to the power bar 200, where the source/drain contact in dashed box 180A' and the source/drain contact in dashed box 182A' are in-line with each other across the second nanodevice ND2. The first dielectric liner may not have an opening. The second dielectric liner may have a first opening where the source/drain contact in dashed box 180A' is connected to the power bar 200. The second dielectric liner may have a second opening where the source/drain contact in dashed box 182A' is connected to the power bar 200.

Figure 20E:
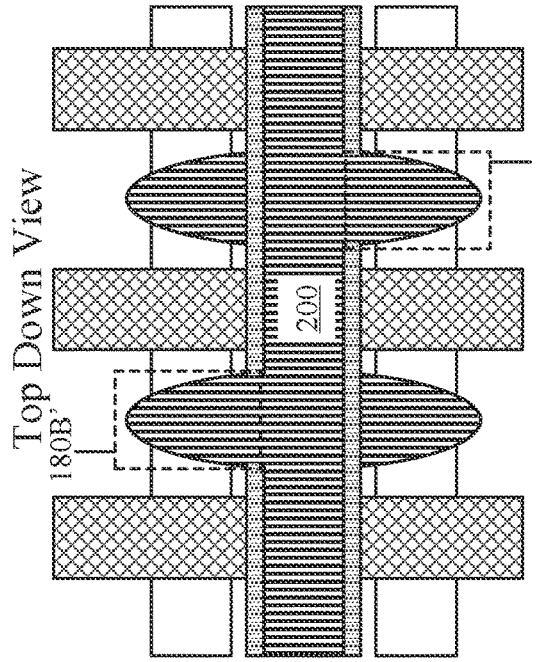

In FIG. 20E, the source/drain contact in dashed box 182A' (e.g., the second source/drain contact 182A of the second nanodevice ND2) and the source/drain contact in dashed box 180B' (e.g., the first source/drain contact 180B of the first nanodevice ND1) are connected to the power bar 200, where the source/drain contact in dashed box 182A' and the source/drain contact in dashed box 180B' are offset from each other across the first nanodevice ND1 and the second nanodevice ND2. The first dielectric liner may have a first opening where the source/drain contact in dashed box 180B' is connected to the power bar 200. The second dielectric liner may have a second opening where the source/drain contact in dashed box 182A' is connected to the power bar 200.

Figure 20F:
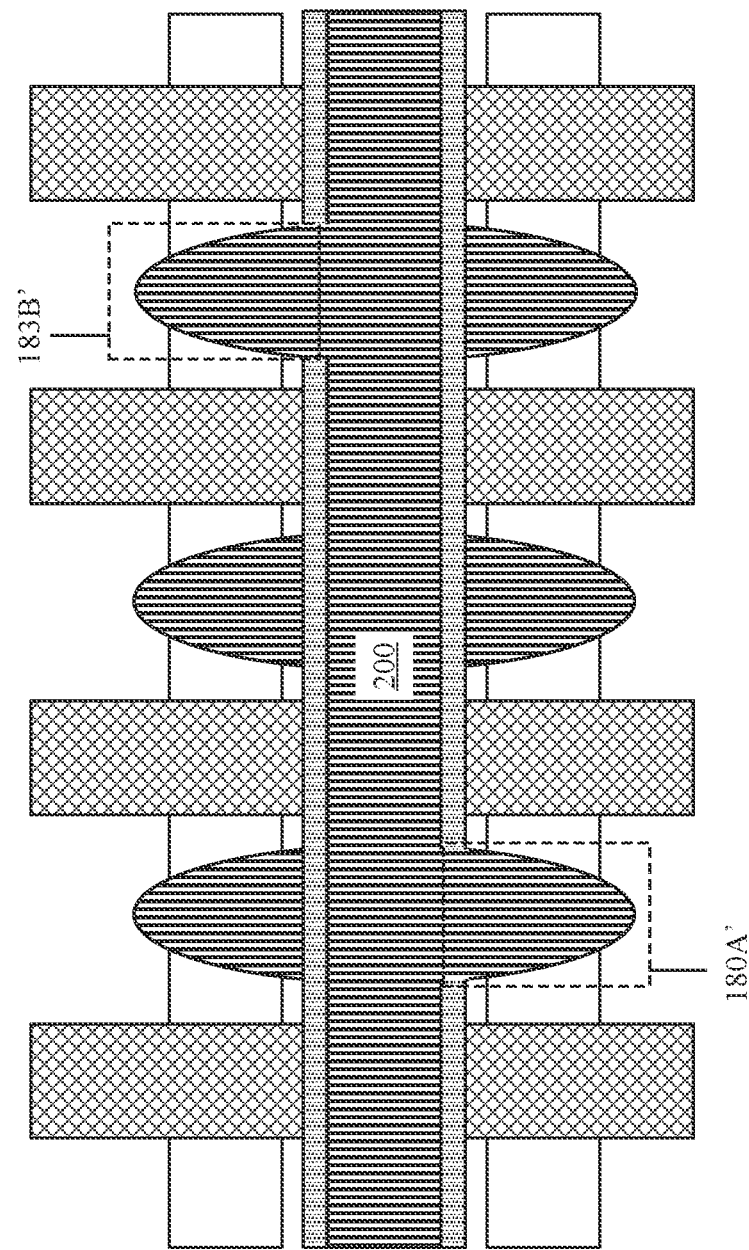

In FIG. 20F, the first nanodevice ND1 may include the first source/drain contact 180B, the second source/drain contact 182B, and a source/drain contact in dashed box 183B'. The second nanodevice may include the first source/drain contact 180A, the second source/drain contact 182A, and a third source/drain contact in dashed box 183A'. The source/drain contact in dashed box 180A' (e.g., the first source/drain contact 180A of the second nanodevice ND2) and the source/drain contact in dashed box 183B' are connected to the power bar 200, where the source/drain contact in dashed box 180A' and the source/drain contact in dashed box 183B' are offset from each other across the first nanodevice ND1 and the second nanodevice ND2. At least one source/drain contact is located between the source/drain contact in dashed box 180A' and the source/drain contact in dashed box 183B'. The first dielectric liner may have a first opening where the source/drain contact in dashed box 183B' is connected to the power bar 200. The second dielectric liner may have a second opening where the source/drain contact in dashed box 180A' is connected to the power bar 200. It may be appreciated that FIGS. 20A-20F are intended for illustrative purposes only, and that in the embodiment of the present invention the power bar 200 may be connected to one or more other source/drains.

Figure 21:
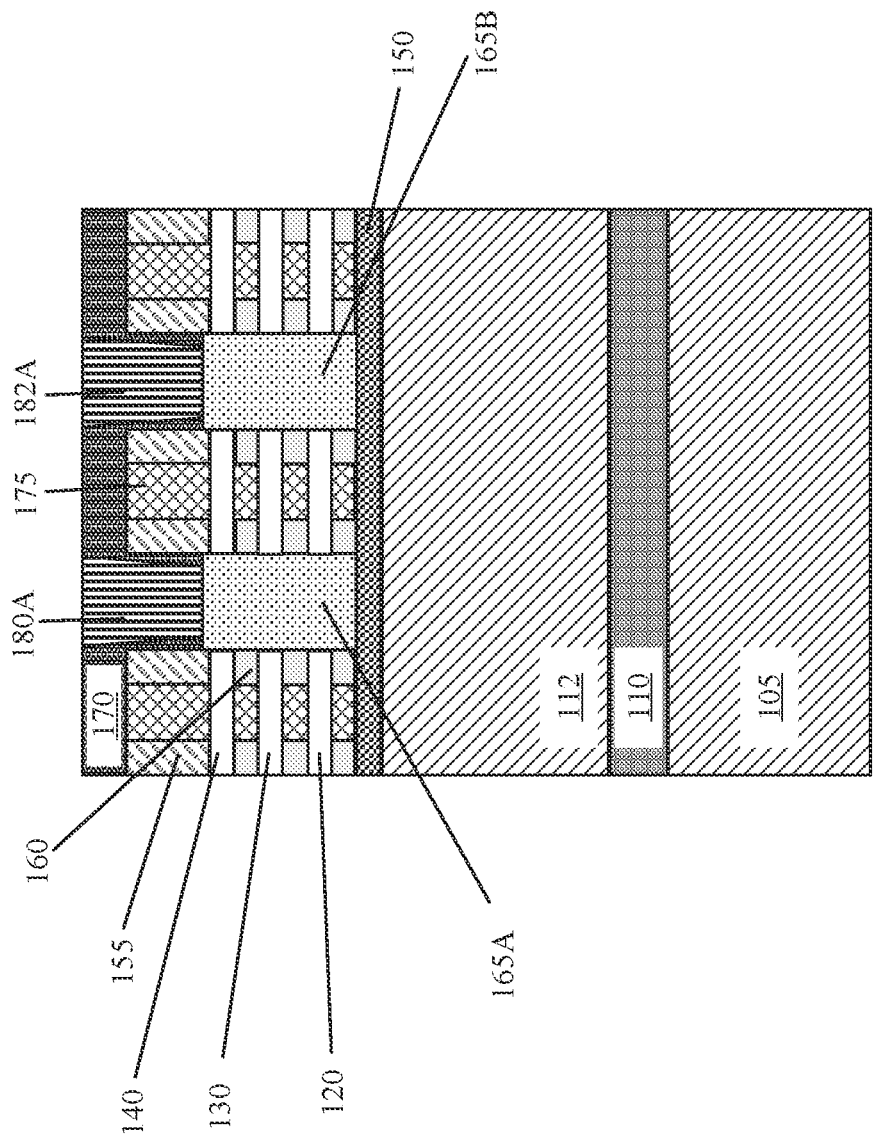
FIGS. 21-23 illustrate cross sections X, $Y_1$, and $Y_2$, respectively, of the plurality of nanodevices after the formation of the power bar, in accordance with the embodiment of the present invention.
Figure 22:
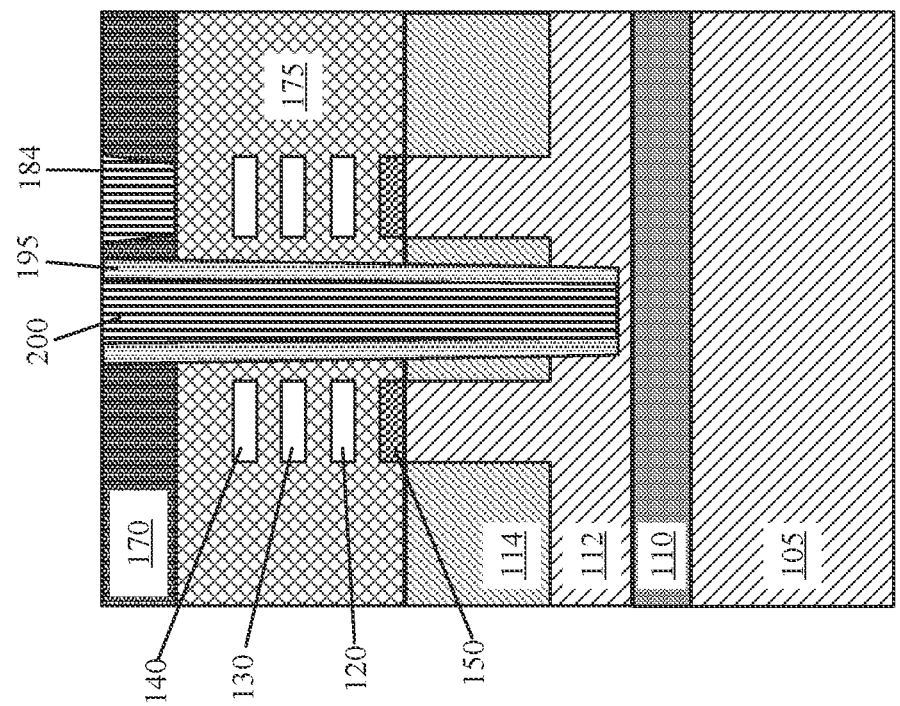

FIGS. 21-23 illustrate cross sections X, $Y_1$, and $Y_2$, respectively, of the plurality of nanodevices ND1, ND2 after the formation of the power bar 200, in accordance with the embodiment of the present invention. A bottom surface of the power bar 200 is in contact with the underlying substrate layer 112. In FIG. 22, the sidewalls of the power bar 200 are in contact with the dielectric liner 195. In FIG. 23, a portion of the sidewalls of the power bar 200 is in contact with the dielectric liner 195, or the dielectric liner 195 and the first source/drain contact 180A of the second nanodevice ND2, respectively. Dashed box 202 illustrates a junction where the first source/drain contact 180A of the second nanodevice ND2 extends through an opening in the second dielectric liner to connect to the power bar 200. A top surface of the power bar 200 and the first source/drain contact 180A of the second nanodevice ND2 are substantially in the same plane and substantially the same height. The first dielectric liner has a first height and the second dielectric liner has a second height, where the first height is greater than the second height. The first source/drain contact 180B of the first nanodevice ND1 is separated from the power bar 200 by the first dielectric liner.

Figure 24:
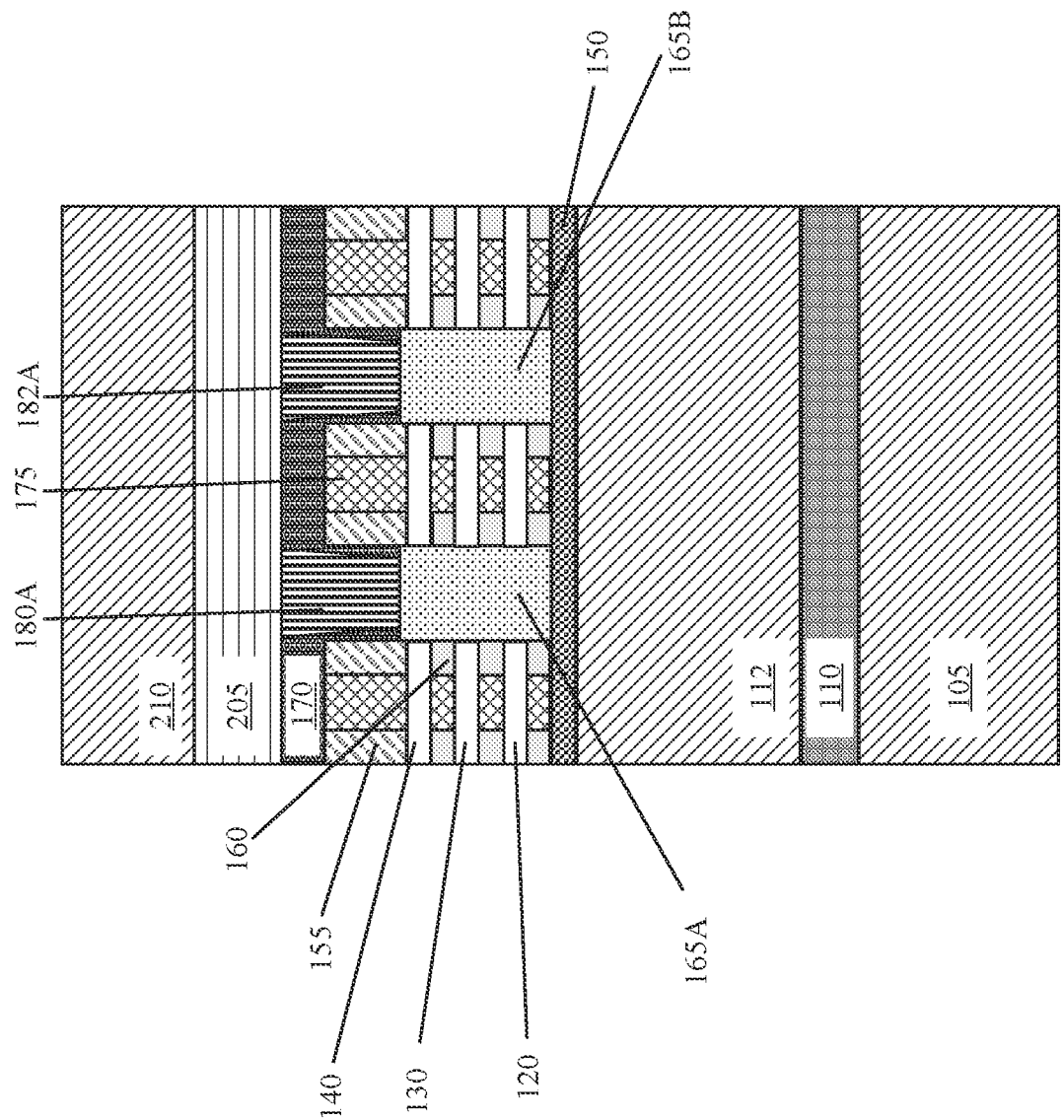
FIGS. 24-26 illustrate cross sections X, $Y_1$, and $Y_2$, respectively, of the plurality of nanodevices after the formation of a back-end-of-line (BEOL) layer and bonding to a carrier wafer, in accordance with the embodiment of the present invention.
Figure 26:
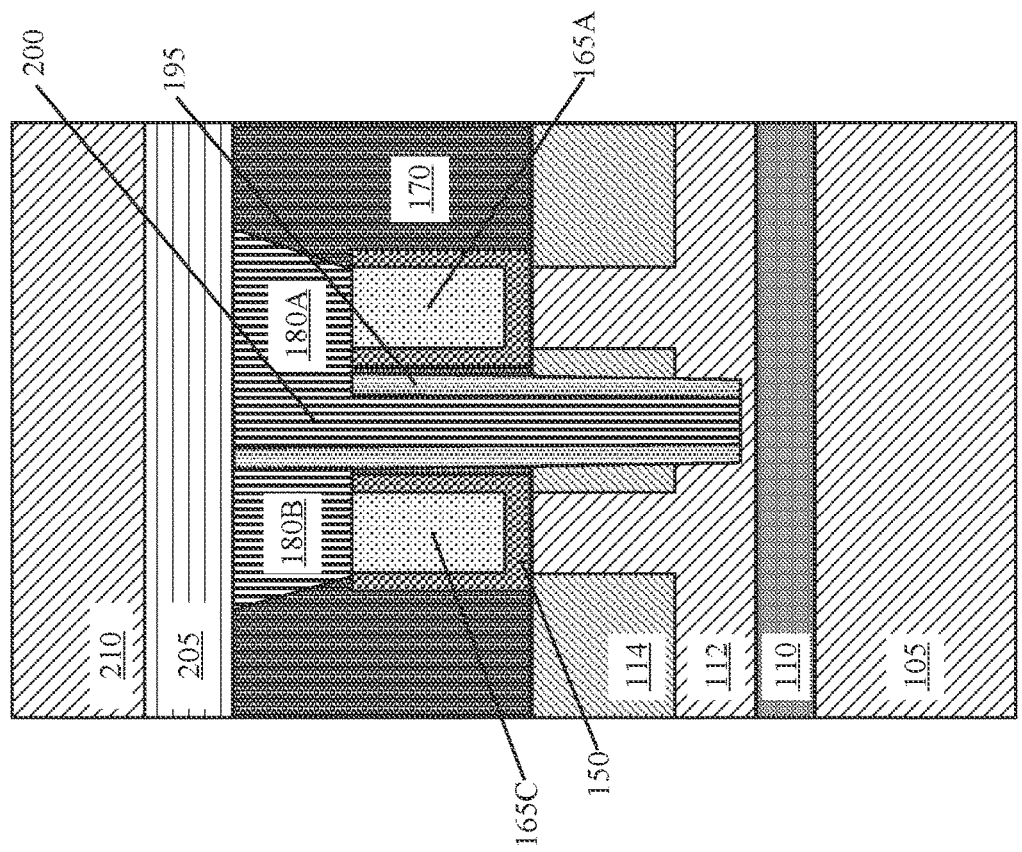
Figure 25:
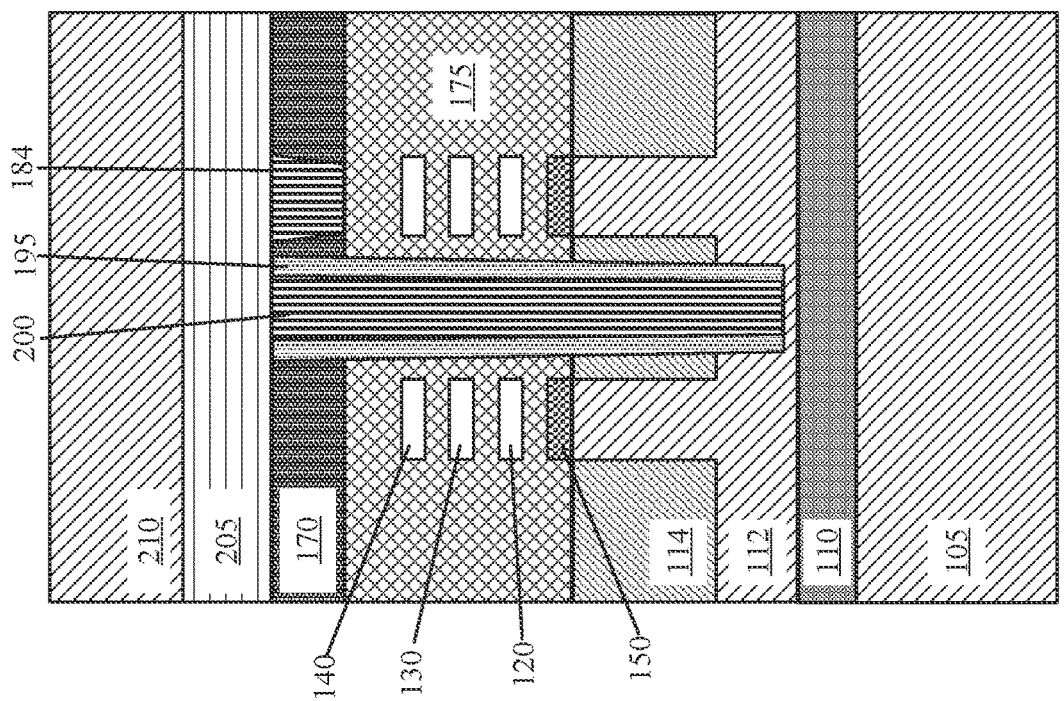

FIGS. 24-26 illustrate cross sections X, $Y_1$, and $Y_2$, respectively, of the plurality of nanodevices ND1, ND2 after the formation of a back-end-of-line (BEOL) layer 205 and bonding to a carrier wafer 210, in accordance with the embodiment of the present invention. The BEOL layer 195 may contain multiple metal layers and vias in between. In FIG. 24, the BEOL layer 205 is formed directly atop the ILD 170, the first source/drain contact 180A of the second nanodevice ND2, and the second source/drain contact 182A of the second nanodevice ND2. In FIG. 25, the BEOL layer 205 is formed directly atop the ILD 170, the gate contact 184, the dielectric liner 195, and the power bar 200. In FIG. 26, the BEOL layer 205 is formed directly atop the ILD 170, the dielectric liner 195, the first source/drain contact 180A of the second nanodevice ND2, and the first source/drain contact 180B of the first nanodevice ND1. In FIGS. 24-26, the carrier wafer 210 is formed directly atop the BEOL layer 205 by depositing a wafer material on the BEOL layer 205.

Figure 27:
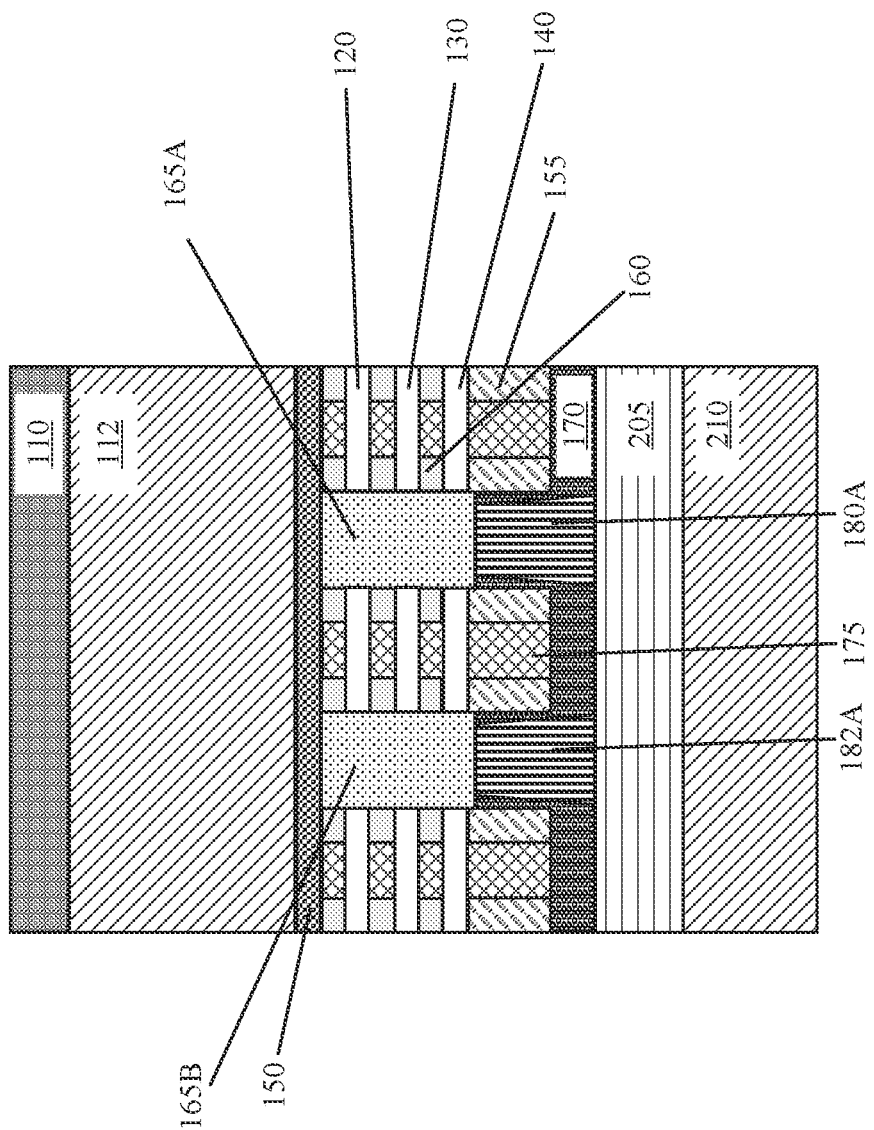
FIGS. 27-29 illustrate cross sections X, $Y_1$, and $Y_2$, respectively, of the plurality of nanodevices after the carrier wafer is flipped and the substrate is removed, in accordance with the embodiment of the present invention.
Figures 28, 29:
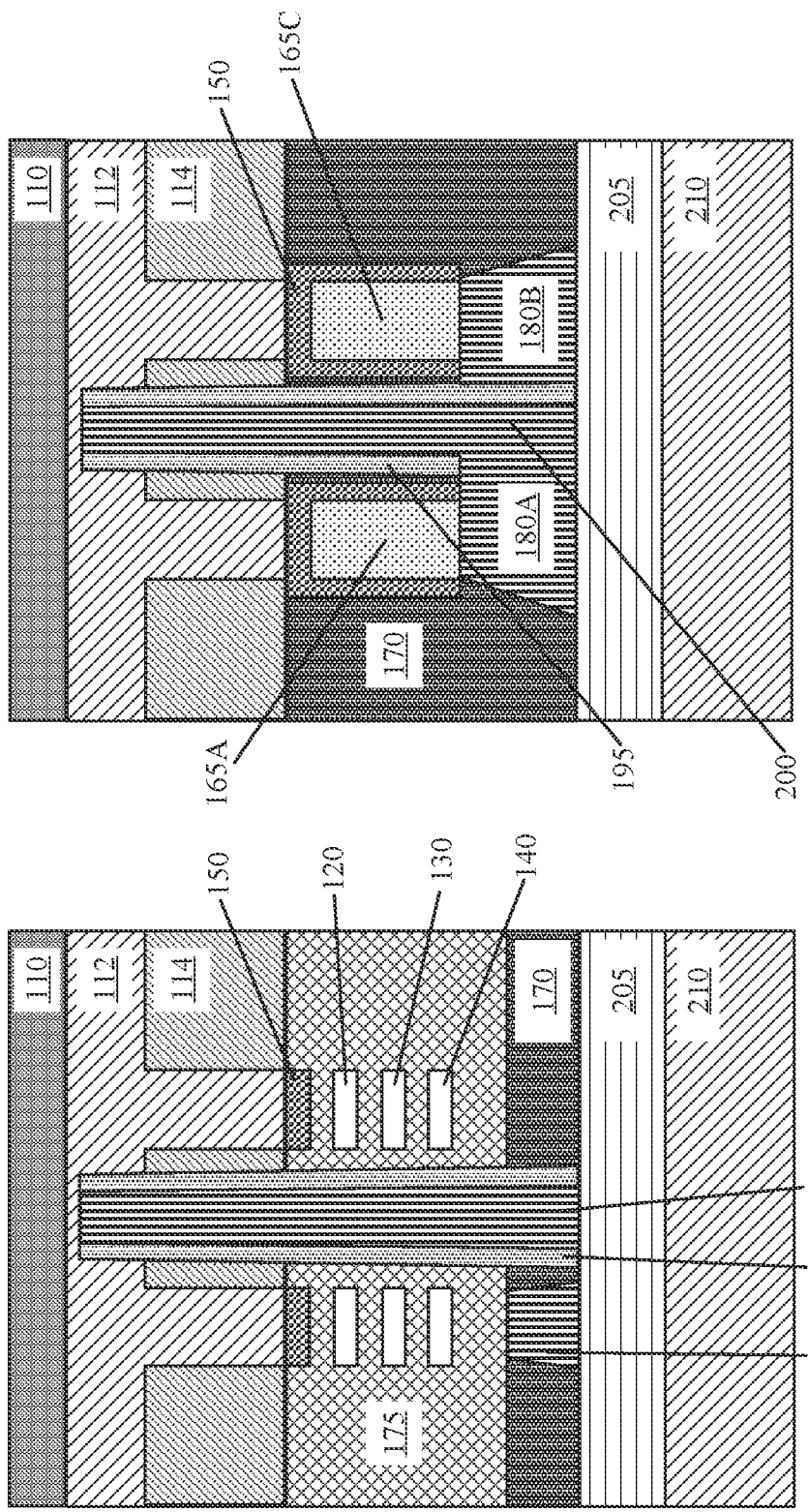

FIGS. 1-26 illustrate the processing of the frontside of the substrate 105, while FIGS. 27-38 illustrate the processing of the backside of the substrate 105. FIGS. 27-29 illustrate cross sections X, $Y_1$, and $Y_2$, respectively, of the plurality of nanodevices ND1, ND2 after the carrier wafer 210 is flipped and the substrate 105 is removed, in accordance with the embodiment of the present invention. The carrier wafer 200 is flipped and the carrier wafer 200 becomes a handler wafer. The substrate 105 is removed by, for example, a combination of processes such as wafer grinding, CMP, and/or selective dry/wet etch, stopping on the etch stop layer 110.

Figure 30:
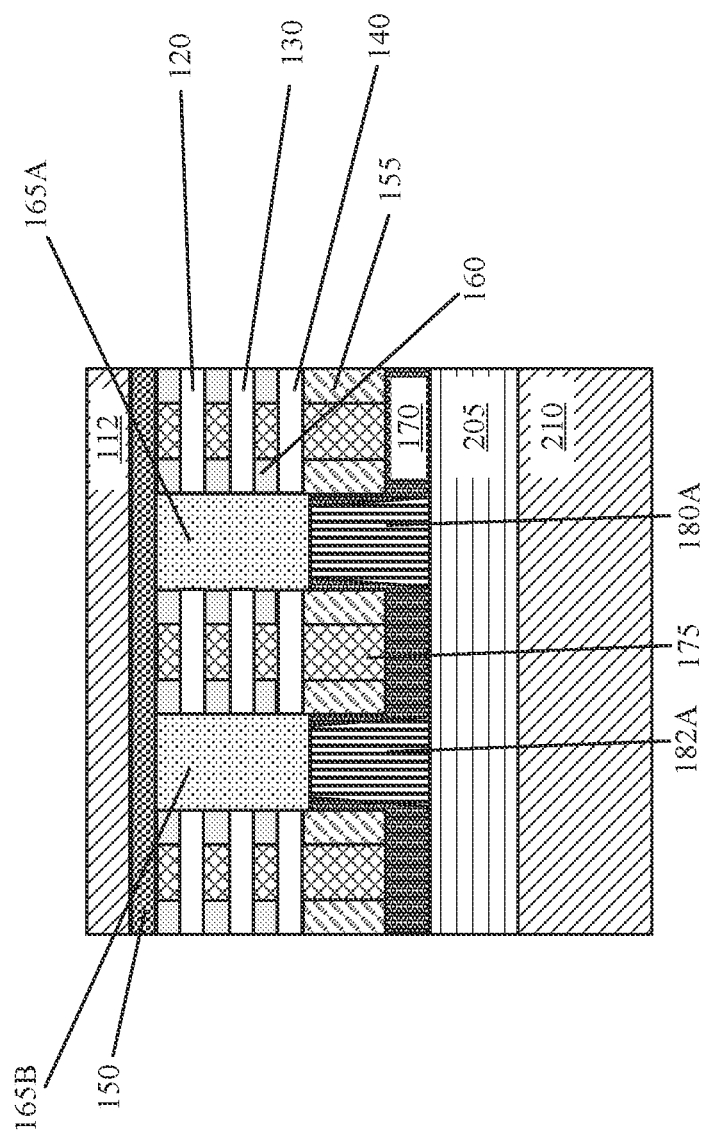
FIGS. 30-32 illustrate cross sections X, $Y_1$, and $Y_2$, respectively, of the plurality of nanodevices after the removal of the etch stop layer and the selective recessing of the underlying substrate layer, in accordance with the embodiment of the present invention.
Figures 31, 32:
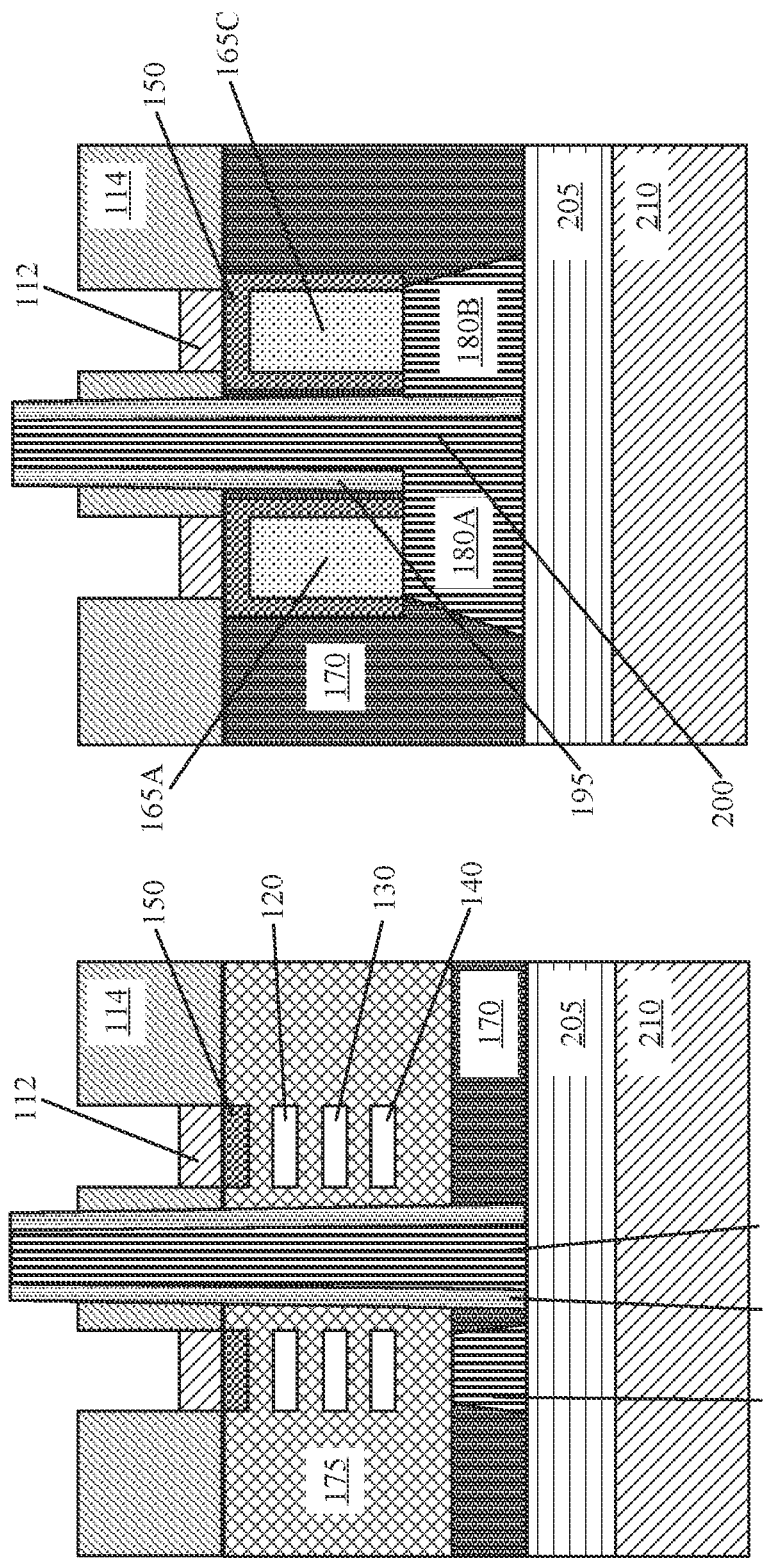

FIGS. 30-32 illustrate cross sections X, $Y_1$, and $Y_2$, respectively, of the plurality of nanodevices ND1, ND2 after the removal of the etch stop layer 110 and the selective recessing of the underlying substrate layer 112, in accordance with the embodiment of the present invention. The etch stop layer 110 is removed to expose the underlying substrate layer 112. The underlying substrate layer 112 is removed by, for example, a selective wet or dry etch process. A top surface of the power bar 200 is no longer in contact with the underlying substrate layer 112.

Figure 33:
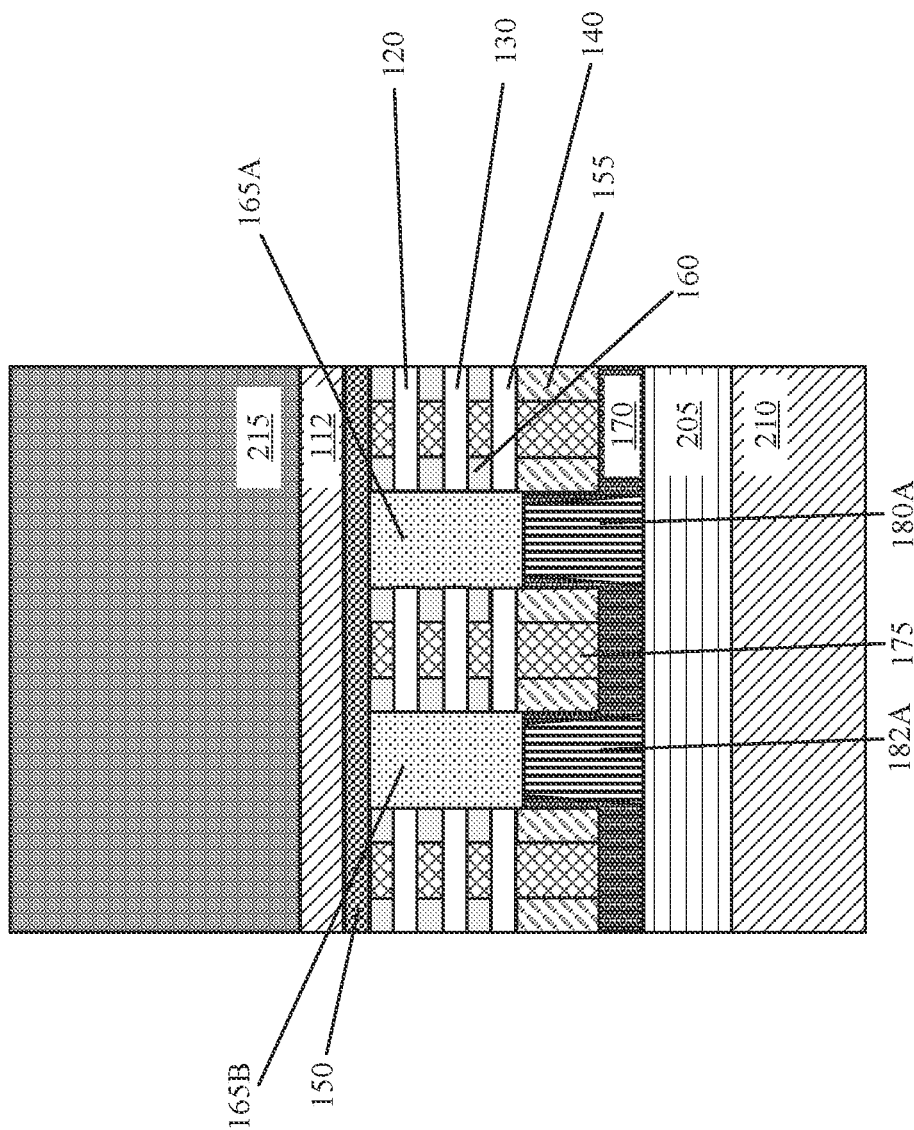
FIGS. 33-35 illustrate cross sections X, $Y_1$, and $Y_2$, respectively, of the plurality of nanodevices after the formation of a plurality of backside power rails (BPRs), in accordance with the embodiment of the present invention.
Figures 34, 35:
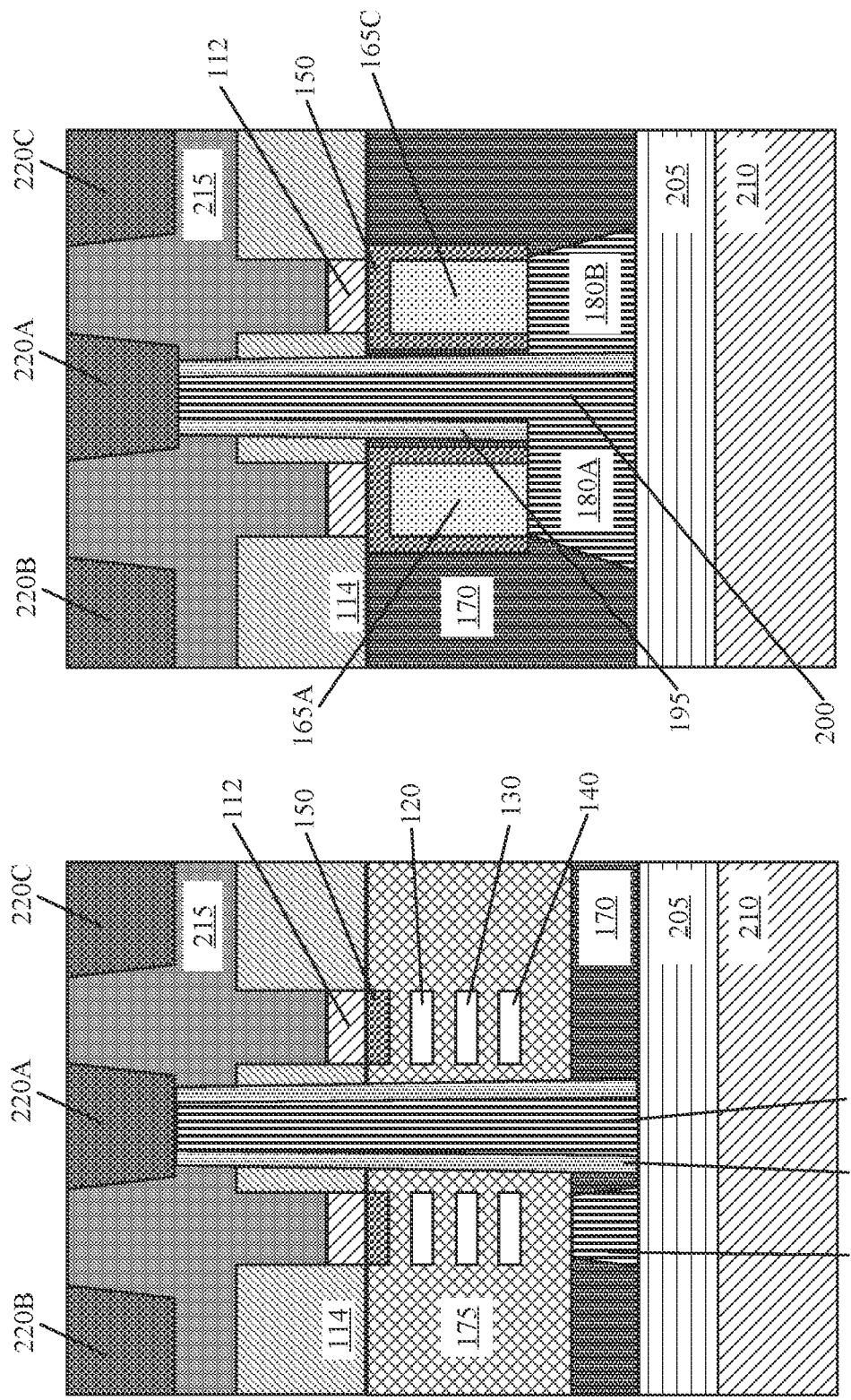

FIGS. 33-35 illustrate cross sections X, $Y_1$, and $Y_2$, respectively, of the plurality of nanodevices ND1, ND2 after the formation of a plurality of backside power rails (BPRs) 220A, 220B, 220C, in accordance with the embodiment of the present invention. In FIG. 33, a backside ILD (BILD) layer 215 is deposited directly atop the underlying substrate layer 112. In FIGS. 34 and 35, the BILD layer 215 is deposited directly atop the underlying substrate layer 112 and the STI region 114. Then, the first BPR 220A, the second BPR 220B, and the third BPR 220C are patterned using conventional lithography and etching processes, followed by metallization (e.g., Cu, Co or Ru fill with adhesion liner such as TiN). The first BPR 220A is formed directly atop the dielectric liner 195, the power bar 200, and the BILD layer 215. A top surface of the power bar 200 is connected to the first BPR 220A. The bottom surface of the first BPR 220A is larger than the top surface of the power bar 200. The first BPR 220A has a positive supply voltage. The second BPR 220B and the third BPR 220C are formed atop the STI region 114, where a bottom surface of the second BPR 220B and the third BPR 220C are in contact with the BILD layer 215. The second BPR 220B is located on one side of the first BPR 220A. The Third BPR 220C is located on an opposite side of the first BPR 220A. The second BPR 220B and the third BPR 220C have a negative supply voltage. In FIG. 35, the first source/drain contact 180B of the first nanodevice ND1 is connected to a first frontside of the third source/drain 165C. The first source/drain contact 180A of the second nanodevice ND2 is connected to a second frontside of the first source/drain 165A, where the power bar 200 extends to a backside of the second nanodevice ND2 to connect to the first BPR 220A.

Figure 36:
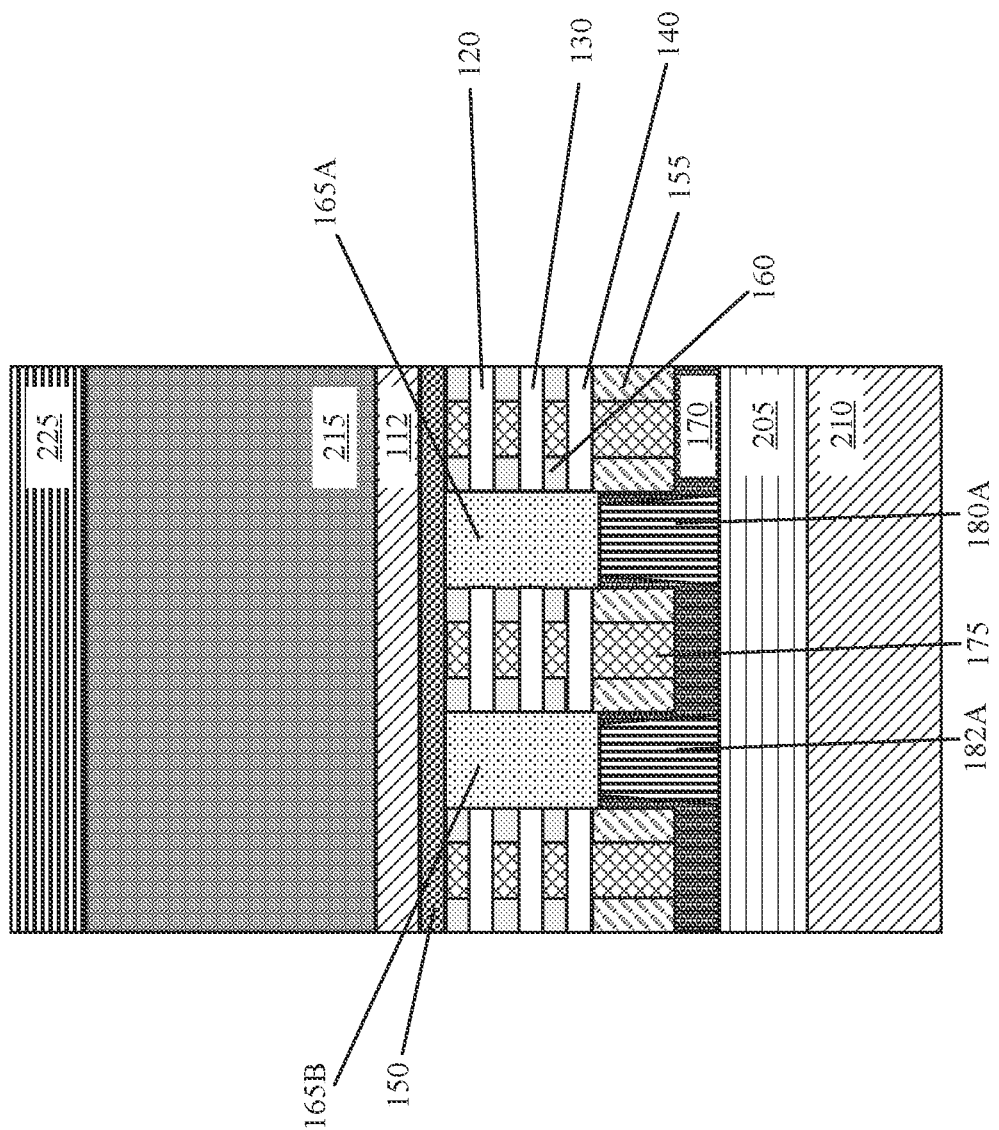

FIGS. 36-38 illustrate cross sections X, $Y_1$, and $Y_2$, respectively, of the plurality of nanodevices ND1, ND2 after the formation of a backside power distribution network (BSPDN) 225, in accordance with the embodiment of the present invention. In FIG. 36, the BSPDN 225 is formed directly atop the BILD layer 215. In FIGS. 37 and 38, the BSPDN 225 is formed directly atop the BILD layer 215, the first BPR 220A, the second BPR 220B, and the third BPR 220C.

The power bar 200 located between the first nanodevice ND1 and the second nanodevice ND2 extends along the first axis through the plurality of gates 175. By removing one or more portions of the dielectric liner 195, at least one source/drain contact extends through one or more openings in the dielectric liner 195 to connect to the power bar 200. The top surface of the power bar 200 is substantially in the same plane and substantially the same height as the at least one source/drain contact that is connected to the power bar 200.

It may be appreciated that FIGS. 1-38 provide only an illustration of one implementation and do not imply any limitations with regard to how different embodiments may be implemented. Many modifications to the depicted environments may be made based on design and implementation requirements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a first nanodevice comprised of a plurality of first transistors, wherein the first nanodevice includes a first source/drain contact;
   a second nanodevice comprised of a plurality of second transistors, wherein the second nanodevice includes a second source/drain contact, wherein the second nanodevice is located adjacent to and parallel to the first nanodevice along a first axis;
   a plurality of gates extending along a second axis perpendicular to the first axis through the first nanodevice and the second nanodevice; and
   a power bar located between the first nanodevice and the second nanodevice, wherein the power bar directly connects to the second source/drain contact and is comprised of a same conductive metal as the second source/drain contact, wherein the direct connection of the power bar to the second source/drain contact forms a contiguous unitary structure, wherein the power bar extends along the first axis through the plurality of gates, wherein a top surface of the power bar and the second source/drain contact are substantially in a same plane, and wherein the top surface of the power bar and the second source/drain contact are substantially a same height.

2. The semiconductor device of claim 1, wherein the power bar is oriented adjacent to and parallel to the first nanodevice and the second nanodevice.

3. The semiconductor device of claim 2, further comprising:
   a first dielectric liner and a second dielectric liner, wherein the first dielectric liner is located between the first nanodevice and the power bar, and wherein the second dielectric liner is located between the second nanodevice and the power bar.

4. The semiconductor device of claim 3, wherein a first height of the first dielectric liner is greater than a second height of the second dielectric liner.

5. The semiconductor device of claim 4, wherein the second dielectric liner has an opening, wherein the second source/drain contact extends through the opening to connect to the power bar.

6. The semiconductor device of claim 5, further comprising:
   a backside power rail located directly atop the power bar, the first dielectric liner, and the second dielectric liner.

7. The semiconductor device of claim 6, wherein:
   the first nanodevice further includes a first source/drain, wherein the first source/drain contact is connected to a first frontside of the first source/drain; and
   the second nanodevice further includes a second source/drain, wherein the second source/drain contact is connected to a second frontside of the second source/drain, wherein the power bar extends to a backside of the second nanodevice to connect to the backside power rail.

8. The semiconductor device of claim 7, wherein the first source/drain contact is separated from the power bar by the first dielectric liner.

9. A semiconductor device comprising:
   a first nanodevice comprised of a plurality of first transistors, wherein the first nanodevice includes a first source/drain contact and a second source/drain contact;
   a second nanodevice comprised of a plurality of second transistors, wherein the second nanodevice includes a third source/drain contact and a fourth source/drain contact, wherein the second nanodevice is located adjacent to and parallel to the first nanodevice along a first axis;
   a plurality of gates extending along a second axis perpendicular to the first axis through the first nanodevice and the second nanodevice; and
   a power bar located between the first nanodevice and the second nanodevice, wherein the power bar directly connects to at least two source/drain contacts and is comprised of a same conductive metal as the two source/drain contacts, wherein the direct connection of the power bar to the two source/drain contacts form a contiguous unitary structure, wherein the power bar extends along the first axis through the plurality of gates.

10. The semiconductor device of claim 9, wherein the power bar is oriented adjacent to and parallel to the first nanodevice and the second nanodevice.

11. The semiconductor device of claim 10, further comprising:
a first dielectric liner and a second dielectric liner, wherein the first dielectric liner is located between the first nanodevice and the power bar, and wherein the second dielectric liner is located between the second nanodevice and the power bar.

12. The semiconductor device of claim 11, wherein:
the power bar is connected to the second source/drain contact and the third source/drain contact;
the first dielectric liner has a first opening where the second source/drain contact is connected to the power bar;
the second dielectric liner has a second opening where the third source/drain contact is connected to the power bar; and
the second source/drain contact and the third source/drain contact are offset from each other across the first nanodevice and the second nanodevice.

13. The semiconductor device of claim 11, wherein:
the power bar is connected to the first source/drain contact and the third source/drain contact;
the first dielectric liner has a first opening where the first source/drain contact is connected to the power bar;
the second dielectric liner has a second opening where the third source/drain contact is connected to the power bar; and
the first source/drain contact and the third source/drain contact are in-line with each other across the first nanodevice and the second nanodevice.

14. The semiconductor device of claim 11, wherein:
the power bar is connected to the first source/drain contact and the second source/drain contact;
the first dielectric liner has a first opening where the first source/drain contact is connected to the power bar;
the first dielectric liner has a second opening where the second source/drain contact is connected to the power bar; and
the first source/drain contact and the second source/drain contact are in-line with each other across the first nanodevice.

15. The semiconductor device of claim 11, wherein:
the power bar is connected to the third source/drain contact and the fourth source/drain contact;
the second dielectric liner has a first opening where the third source/drain contact is connected to the power bar;
the second dielectric liner has a second opening where the fourth source/drain contact is connected to the power bar; and
the third source/drain contact and the fourth source/drain contact are in-line with each other across the second nanodevice.

16. The semiconductor device of claim 11, wherein:
the power bar is connected to the first source/drain contact and the fourth source/drain contact;
the first dielectric liner has a first opening where the first source/drain contact is connected to the power bar;
the second dielectric liner has a second opening where the fourth source/drain contact is connected to the power bar; and
the first source/drain contact and the fourth source/drain contact are offset from each other across the first nanodevice and the second nanodevice.

17. The semiconductor device of claim 11, further comprising:
a plurality of gates extending perpendicular to a first axis along a second axis through the first nanodevice and the second nanodevice, wherein the power bar extends along the first axis through the plurality of gates.

18. A semiconductor device comprising:
a first nanodevice comprised of a plurality of first transistors, wherein the first nanodevice includes a first source/drain contact, a second source/drain contact, and a third source/drain contact;
a second nanodevice comprised of a plurality of second transistors, wherein the second nanodevice includes a fourth source/drain contact, a fifth source/drain contact, and a sixth source/drain contact, wherein the second nanodevice is located adjacent to and parallel to the first nanodevice along a first axis;
a plurality of gates extending along a second axis perpendicular to the first axis through the first nanodevice and the second nanodevice; and
a power bar located between the first nanodevice and the second nanodevice, wherein the power bar directly connects to at least two source/drain contacts and is comprised of a same conductive metal as the two source/drain contacts, wherein the direct connection of the power bar to the two source/drain contacts form a contiguous unitary structure, wherein the power bar extends along the first axis through the plurality of gates.

19. The semiconductor device of claim 18, further comprising:
a first dielectric liner and a second dielectric liner, wherein the first dielectric liner is located between the first nanodevice and the power bar, and wherein the second dielectric liner is located between the second nanodevice and the power bar.

20. The semiconductor device of claim 19, wherein:
the power bar is connected to the third source/drain contact and the fourth source/drain contact;
the first dielectric liner has a first opening where the third source/drain contact is connected to the power bar; and
the second dielectric liner has a second opening where the fourth source/drain contact is connected to the power bar.

21. The semiconductor device of claim 20, wherein the third source/drain contact and the fourth source/drain contact are offset from each other across the first nanodevice and the second nanodevice.

22. The semiconductor device of claim 21, wherein at least one source/drain contact is located between the third source/drain contact and the fourth source/drain contact.

23. The semiconductor device of claim 22, further comprising:
at least four gates extending perpendicular to a first axis along a second axis through the first nanodevice and the second nanodevice, wherein the power bar extends along the first axis through the at least four gates.

24. A method of making a semiconductor device, the method comprising:
forming a first nanodevice comprised of a plurality of first transistors, wherein the first nanodevice includes a first source/drain contact;
forming a second nanodevice comprised of a plurality of second transistors, wherein the second nanodevice includes a second source/drain contact, wherein the second nanodevice is located adjacent to and parallel to the first nanodevice along a first axis;

forming a plurality of gates extending along a second axis perpendicular to the first axis through the first nanodevice and the second nanodevice; and forming a power bar located between the first nanodevice and the second nanodevice, wherein the power bar directly connects to the second source/drain contact and is comprised of a same conductive metal as the second source/drain contact, wherein the direct connection of the power bar to the second source/drain contact forms a contiguous unitary structure, wherein the power bar extends along the first axis through the plurality of gates, wherein a top surface of the power bar and the second source/drain contact are substantially in a same plane, and wherein the top surface of the power bar and the second source/drain contact are substantially a same height.

25. The method of claim 24, wherein the first source/drain contact, the second source/drain contact, and the power bar are formed by removing a lithography mask layer and a portion of a dielectric liner, wherein a space created by the removal of the lithography mask layer and the portion of the dielectric liner is filled with a conductive metal.

\* \* \* \* \*